(12) United States Patent
Carmean et al.

(10) Patent No.: US 9,887,700 B2
(45) Date of Patent: *Feb. 6, 2018

(54) PHASE-MODE BASED SUPERCONDUCTING LOGIC

(71) Applicant: Microsoft Technology Licensing, LLC, Redmond, WA (US)

(72) Inventors: Douglas Carmean, Seattle, WA (US); Alexander Braun, Baltimore, MD (US); Anna Y. Herr, Ellicott City, MD (US); Quentin P. Herr, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/361,411

(22) Filed: Nov. 26, 2016

(65) Prior Publication Data

US 2017/0117901 A1 Apr. 27, 2017

Related U.S. Application Data

(63) Continuation of application No. 14/919,588, filed on Oct. 21, 2015, now Pat. No. 9,543,959.

(51) Int. Cl.
*H03K 19/195* (2006.01)
*H03K 3/38* (2006.01)
(Continued)

(52) U.S. Cl.
CPC ........... *H03K 19/195* (2013.01); *H03K 3/037* (2013.01); *H03K 3/38* (2013.01); *H03K 19/0008* (2013.01); *H03K 19/20* (2013.01)

(58) Field of Classification Search
CPC ..... H03K 19/095; H03K 19/0008; H03K 3/38
(Continued)

(56) References Cited

U.S. PATENT DOCUMENTS

| 4,501,975 A | 2/1985 | Josephs et al. |
| 5,552,735 A | 9/1996 | Kang et al. |

(Continued)

FOREIGN PATENT DOCUMENTS

JP S59185093 A 10/1984

OTHER PUBLICATIONS

"International Search Report and Written Opinion Issued in PCT Application No. PCT/US2016/056699", dated Jan. 25, 2017, 12 Pages.

(Continued)

*Primary Examiner* — Daniel D Chang
(74) *Attorney, Agent, or Firm* — Singh Law, PLLC; Ranjeev Singh

(57) ABSTRACT

A device including Josephson junctions, and a terminal for receiving a sinusoidal clock signal for providing power to the Josephson junctions, is provided. The device further includes a terminal for receiving an input signal, a clock terminal for receiving a return-to-zero clock signal, and at least one latch. The device also includes at least one logic gate including at least a subset of the Josephson junctions, for processing the input signal and the return-to-zero clock signal to generate a first signal for the at least one latch. Additionally, the device includes at least one phase-mode logic inverter for processing the return-to-zero clock signal to generate a second signal for the at least one latch. The device also includes an output terminal for providing an output of the at least one latch by processing the first signal and the second signal.

20 Claims, 23 Drawing Sheets

(51) Int. Cl.
*H03K 19/00* (2006.01)
*H03K 3/037* (2006.01)
*H03K 19/20* (2006.01)

(58) Field of Classification Search
USPC .......................... 326/4, 3; 327/367, 217, 218
See application file for complete search history.

(56) References Cited

U.S. PATENT DOCUMENTS

| | | | |
|---|---|---|---|
| 5,942,997 | A | 8/1999 | Silver et al. |
| 5,963,351 | A | 10/1999 | Kaplounenko et al. |
| 6,518,786 | B2 | 2/2003 | Herr |
| 6,750,794 | B1 | 6/2004 | Durand et al. |
| 7,680,474 | B2 * | 3/2010 | Kirichenko ............ H03D 7/005 341/133 |
| 7,724,020 | B2 | 5/2010 | Herr |
| 7,786,748 | B1 | 8/2010 | Herr |
| 8,401,600 | B1 * | 3/2013 | Filippov .............. H04B 1/0014 505/190 |
| 8,489,163 | B2 | 7/2013 | Herr et al. |
| 2003/0106069 | A1 | 6/2003 | Crinon |
| 2009/0322374 | A1 | 12/2009 | Przybysz et al. |
| 2013/0040818 | A1 | 2/2013 | Herr et al. |

OTHER PUBLICATIONS

Herr, et al., "Ultra-Low-Power Superconductor Logic", In Journal of Applied Physics, vol. 109, Issue 10, May 2011, 7 pages.
"Forecasting Superconductive Electronics Technology", In the Journal of Next Wave, vol. 20, Issue 3, Apr. 22, 2014, 10 pages.
Oberg, Timothy Oliver, "Superconducting Logic Circuits Operating With Reciprocal Magnetic Flux Quanta", In Dissertation in Doctor of Philosophy, Retrieved on: Jul. 28, 2015, 337 pages.
Chen, et al., "Rapid Single Flux Quantu, T-Flip Flop Operating up to 770 GHz", in IEEE Transactions on Applied Superconductivity, vol. 9, Issue 2, Jun. 1999. pp. 3212-3215.
Ortlepp, et al., "Flip-Flopping Fractional Flux Quanta", In Publication of Science Express, vol. 312, No. 5779, Jun. 2006, 14 pages.
Balashov, et al., "Passive Phase Shifter for Superconducting Josephson Circuits", In IEEE Transactions on Applied Superconductivity, vol. 17, Issue 2, Jun. 2007, pp. 142-145.
Gaj, et al., "Timing of Multi-Gigahertz Rapid Single Flux Quantum Digital Circuits", In the Journal of VLSI Signal Processing, vol. 9, Issue 1-2, Jan. 1995, 28 pages.
"Ex Parte Quale Action Issued in U.S. Appl. No. 14/919,588", dated Jun. 23, 2016, 6 Pages.
"Notice of Allowance Issued in U.S. Appl. No. 14/919,588", dated Aug. 31, 2016, 8 Pages.
"Second Written opinion issued in PCT Application No. PCT/US2016/056699", dated Sep. 13, 2017, 6 Pages.

* cited by examiner

PHASE-MODE BASED SUPERCONDUCTING LOGIC

This application claims the benefit of priority under 35 U.S.C. § 120 to U.S. patent application Ser. No. 14/919,588, entitled "Phase-Mode Based Superconducting Logic" filed on Oct. 21, 2015, the disclosure of which is incorporated herein in its entirety by reference.

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption, at high clock speeds, by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, certain amount of power is wasted not only as a result of the requirement to maintain the state of the CMOS transistors, but also as a result of the current leakage.

An alternative approach to the use of processors, and related components, based on CMOS technology, is the use of superconducting logic based devices.

SUMMARY

In one example, the present disclosure relates to a device including a plurality of Josephson junctions and at least one terminal for receiving a sinusoidal clock signal for providing power to the at least the plurality of Josephson junctions. The device may further include at least one terminal for receiving an input signal and at least one clock terminal for receiving a return-to-zero clock signal. The device may further include at least one latch. The device may further include at least one logic gate comprising at least a subset of the plurality of Josephson junctions, for processing the input signal and the return-to-zero clock signal to generate a first signal for the at least one latch. The device may further include at least one phase-mode logic inverter for processing the return-to-zero clock signal to generate a second signal for the at least one latch. The device may further include at least one output terminal for providing an output of the at least one latch by processing the first signal and the second signal.

In another aspect, a method in a device including: (1) a plurality of Josephson junctions, (2) at least one latch, and (3) a plurality of logic gates, comprising at least a subset of the plurality of Josephson junctions, is provided. The method may include receiving a sinusoidal clock signal for providing power to the at least the plurality of Josephson junctions, receiving a return-to-zero clock signal, and receiving an input signal. The method may further include using at least the subset of the plurality of logic gates, processing the input signal and the return-to-zero clock signal to generate a first signal for the at least one latch. The method may further include using at least a phase-mode logic inverter, processing the return-to-zero clock signal to generate a second signal for the at least one latch. The method may further include, based on at least the first signal and the second signal, providing an output of the at least one latch.

In another aspect, the present disclosure relates to a device including a plurality of Josephson junctions and at least one terminal for receiving a sinusoidal clock signal for providing power to the at least the plurality of Josephson junctions, where the sinusoidal clock signal has at least four phases. The device may further include at least one terminal for receiving an input signal and at least one clock terminal for receiving a return-to-zero clock signal. The device may further include at least one logic gate comprising at least a subset of the plurality of Josephson junctions, for processing the input signal and the return-to-zero clock signal to generate a first signal for the at least one latch. The device may further include at least one inverter for processing the return-to-zero clock signal to generate a second signal for the at least one latch. The device may further include at least one output terminal for providing an output of the at least one latch by processing the first signal and the second signal, where the output of the at least one latch is persistent across the at least four phases of the sinusoidal clock signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
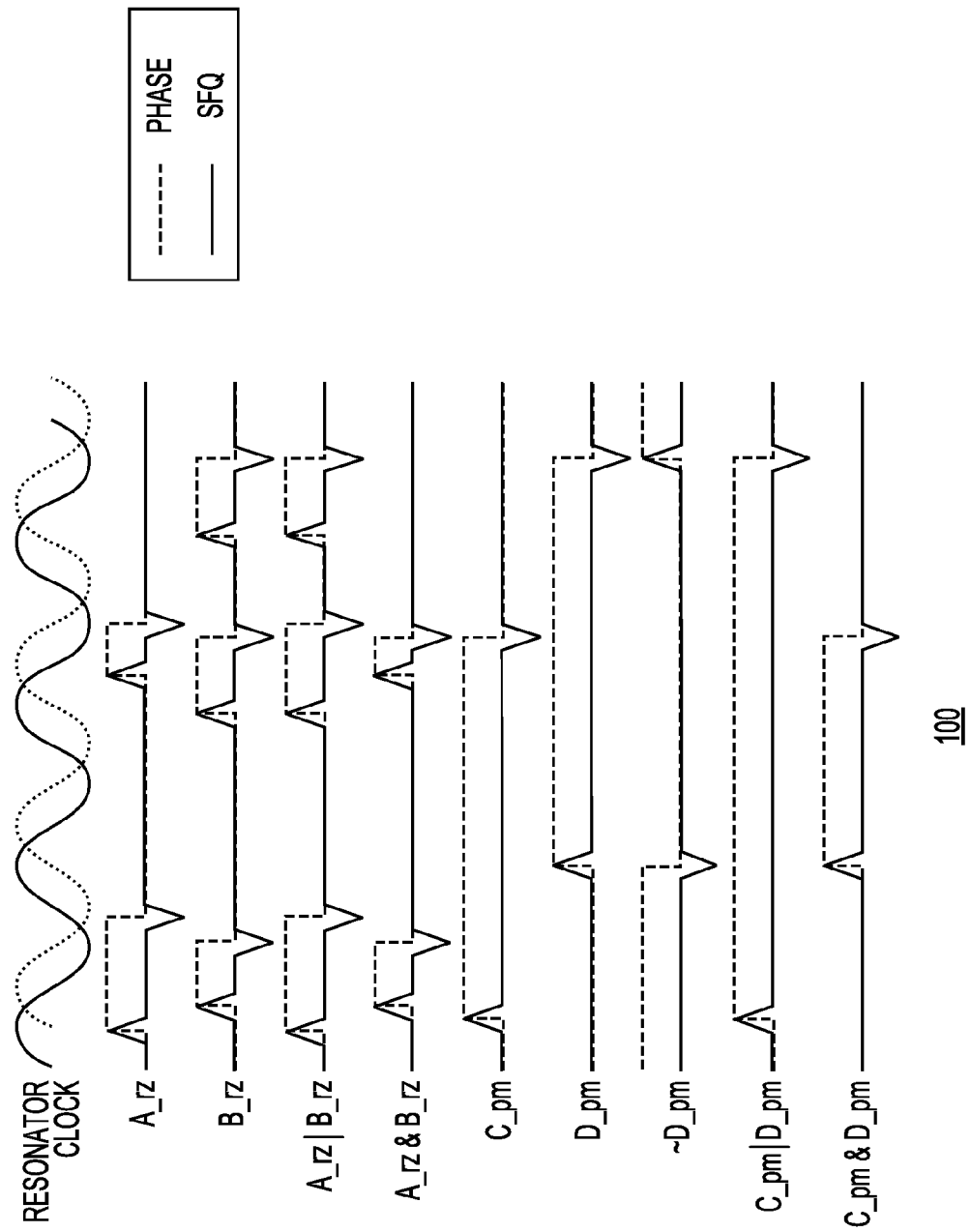
FIG. 1 shows phase-mode logic waveforms in accordance with one example.

Examples described in this disclosure relate to superconducting logic based devices, such as flip-flops, registers, counters, and other processing components. Certain examples further relate to phase-mode logic based superconducting devices. These superconducting devices may also use phase-mode logic (PML) based devices. In the PML based devices, a logical '1' may be encoded as a phase high and a logical '0' may be encoded as phase low. The transitions between phase high and phase low may be event-triggered by single flux quantum (SFQ) pulses as described later. Such PML based devices may include PML circuits that may act as low-power superconductor logic circuits. Unlike CMOS transistors, the PML circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the PML circuits. As an example, superconductors are materials that can carry a direct electrical current (DC) in the absence of an electric field. Such materials have almost zero resistance. Exemplary superconductors, such as Niobium has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In PML circuits, in one example, the SIS type of junction may be part of a super-conducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In PML circuits, each Josephson junction may be part of one or more superconducting loops. The phase difference across the junction may be modulated by the magnetic flux applied to the loop.

Various PML circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The PML circuits may advantageously have zero static power dissipation because of the absence of bias resistors. In addition, at least some of the components of the PML circuits may be powered using alternating current (AC) power thereby eliminating the ground return current.

The building blocks of exemplary PML circuits may include various types of logic gates. Exemplary logic gates, include an AND gate, an OR gate, a logical A-and-not-B gate and a logical AND & OR (AND/OR) gate. The A-and-not-B gate may have two inputs and one output (Q). An input pulse A may propagate to output Q unless an input pulse B comes first. The AND/OR gate may have two inputs and two outputs (Q1 and Q2). One output (e.g., Q1) may provide a logical OR output and the other output (e.g., Q2) may provide a logical AND output.

FIG. 1 shows phase-mode logic waveforms in accordance with one example. In phase-mode logic, digital values may be encoded as Josephson junction (JJ) phase. A high phase may indicate a logic '1' and a low phase may indicate a logic '0.' Unlike the traditional reciprocal quantum logic (RQL) encoding, these values are persistent across RQL clock cycles because there is no requirement for a reciprocal pulse to reset the JJ phase. As an example, if an AC clock, with four phases, were used to power the phase-mode logic circuit, the output of the phase-mode logic circuit may be persistent across all four phases of the AC clock. Thus, advantageously, the persistent nature of this data encoding may be leveraged into a new design methodology. To illustrate an example of the phase-mode logic, FIG. 1 shows the behavior of a non-phase-mode logic and the behavior of the phase-mode logic based on the same clock (Resonator Clock). The Resonator Clock may be a sinusoidal clock that may provide AC power to the superconducting logic circuits that comprise the phase-mode logic devices. FIG. 1 shows two such clocks that can provide a four-phase clock. In one example, cross-wired transformers (not shown) may be used to produce a four-phase clock from two Resonant Clocks. For example, by coupling the clock lines to the Josephson junctions in the gates of a respective superconducting circuit in a wound or counter-wound fashion, four phases of clock may be derived. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation.

With continued reference to FIG. 1, the return-to-zero A signal (labeled as A_rz) and the return-to-zero B signal (labeled B_rz), when processed by an OR gate may generate SFQ pulses represented by the A OR B return-to-zero signal (labeled A_rz|B_rz). Similarly, the return-to-zero A signal (labeled as A_rz) and the return-to-zero B signal (labeled B_rz), when processed by an AND gate may generate SFQ pulses represented by the A AND B return-to-zero signal (labeled A_rz & B_rz). An integral of the SFQ pulses (Phase) represented by the dotted lines may be a non-return to zero signal. FIG. 1 further shows an example of a phase-mode signal C (labeled C_pm) and another phase-mode signal D (labeled D_pm). These phase-mode signals may not be required to have a positive voltage pulse always precede the negative voltage pulse. Also, shown in FIG. 1 is an inverted version of the phase-mode signal D (labeled ~D_pm). The phase-mode C signal (labeled as C_pm) and the phase-mode D signal (labeled D_pm), when processed by an OR gate may generate phase-mode signals (dotted) represented by the C OR D phase-mode signal (labeled C_pm|D_pm). Similarly, the phase-mode C signal (labeled as C_pm) and the phase-mode D signal (labeled D_pm), when processed by an AND gate may generate phase-mode signals (dotted) represented by the C AND D phase-mode signal (labeled C_pm|D_pm).

Figure 2:
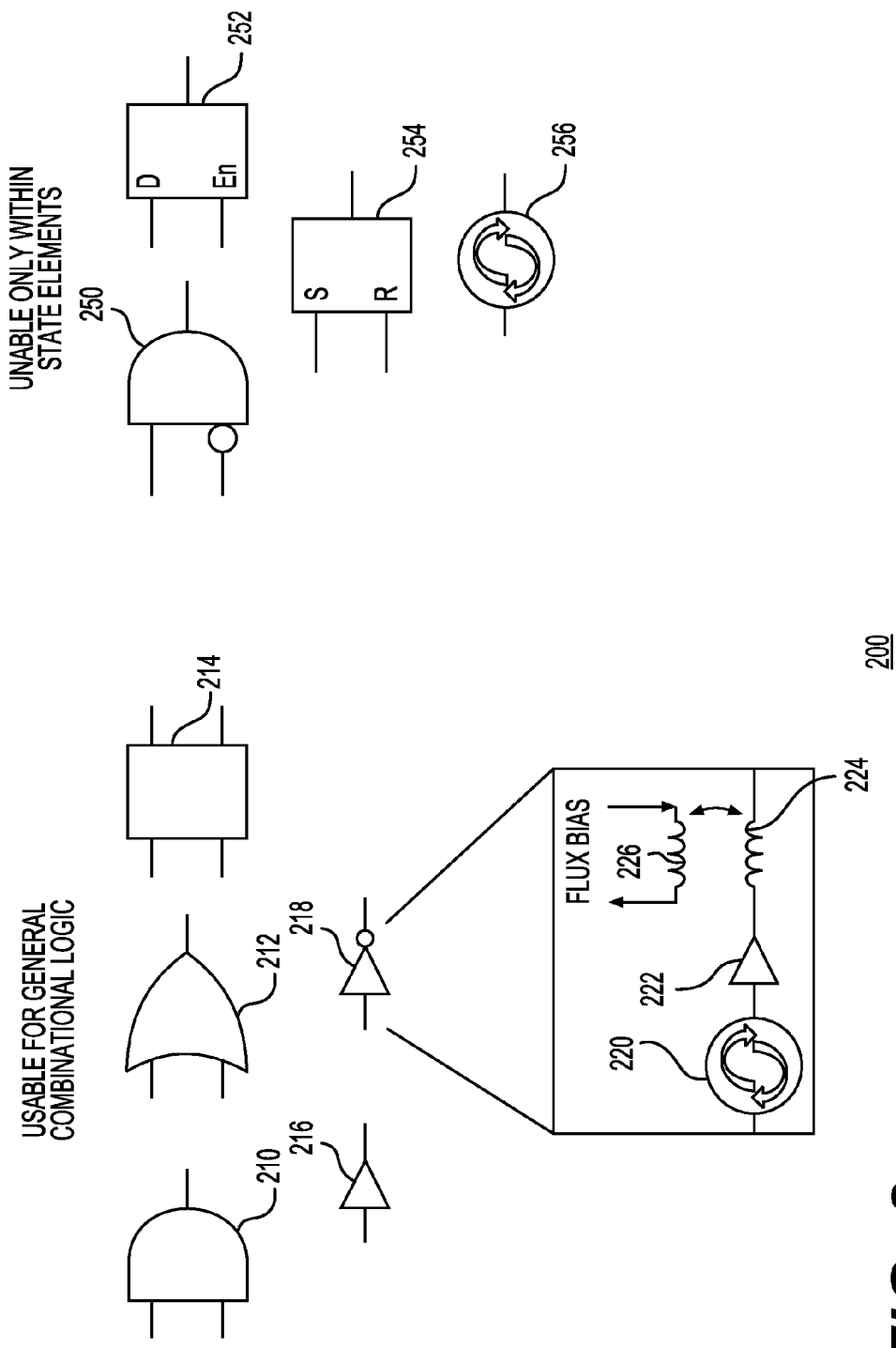
FIG. 2 shows diagrams of examples of logic gates for use with phase-mode logic.

FIG. 2 shows diagrams of examples of logic gates for use with phase-mode logic. Phase-mode logic may use modified versions of superconducting logic gates, e.g., reciprocal quantum logic (RQL) gates. Some of these gates may be used as part of general combinational logic built using these gates, while others may only be used within state elements. Combinational logic using phase-mode logic may be designed using gates, such as AND/OR gates that provide the basic Boolean functions. In one example, both inputs to such gates, however, must be phase aligned. In other words, they must arrive in the same phase at the inputs, but arriving on different resonator clock cycles may be allowed. As an example, an AND gate 210, an OR gate 212, an AND/OR gate 214, a Josephson transmission line (JTL) 216, and phase-mode logic inverter 218 may be useable with general combinational phase-mode logic. As an example, A-and-not-B gate 250, D flip flop 252, SR-latch 254, and flip gate 256 may be useable only within state elements. Phase-mode logic inverter 218 may implement an inverter by transforming a positive SFQ pulse into a negative SFQ pulse and by transforming a negative SFQ pulse into a positive SFQ pulse. In one example, phase-mode logic inverter 218 may include a flip gate 220, an inverter 222, an inductor 224, and another inductor 226 for coupling a flux bias to phase-mode logic inverter 218.

Figure 3:
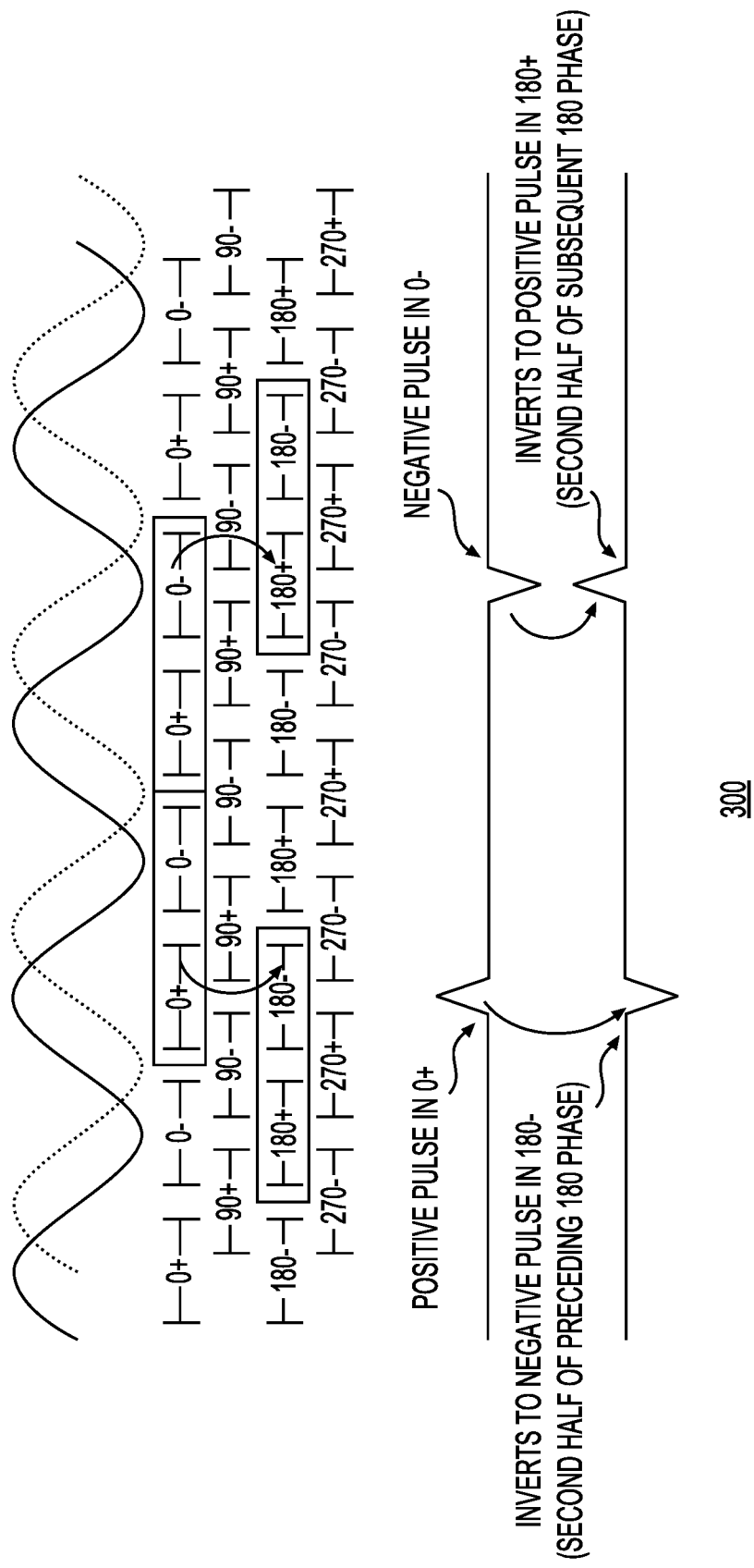
FIG. 3 shows phase assignments before and after a phase-mode logic inverter in accordance with one example.

FIG. 3 shows phase assignments before and after a phase-mode logic inverter. The phase assignments are illustrated in reference to AC power clocks (e.g., resonator clocks) and in reference to four phase domains (0, 90, 180, and 270 degrees). Each phase has a positive and a negative half. During the positive half, devices can propagate positive pulses. During the negative half, the devices can propagate negative pulses. Transitioning through a phase-mode logic inverter (e.g., 218 of FIG. 2) moves the pulse from its current phase domain to another phase domain that is 180 degrees out of phase. Thus, for example, a positive pulse (e.g., in 0+ degree phase domain) inverts to a negative pulse (e.g., in −180 degrees phase domain) in the second half of the preceding 180 degrees phase domain. Similarly, a negative pulse (e.g., in 0+ degree phase domain) inverts to a positive pulse (e.g., in +180 degrees phase domain) in the first half of the subsequent 180 degrees phase domain. The inversion itself causes minimal time delay, but also causes a 180 degree phase shift. This phase shift may necessitate two phase boundaries to realign inverted and non-inverted signals for arrival into a two input gate. If an inversion can be generated early, then the required two phase offset may already exist in the circuit. If not, additional phase boundaries may need to be added. At the phase boundary—where junctions may be coupled to a clock line with a different phase—early pulses may need to wait until the rise of the clock signal in the next phase.

Figure 4:
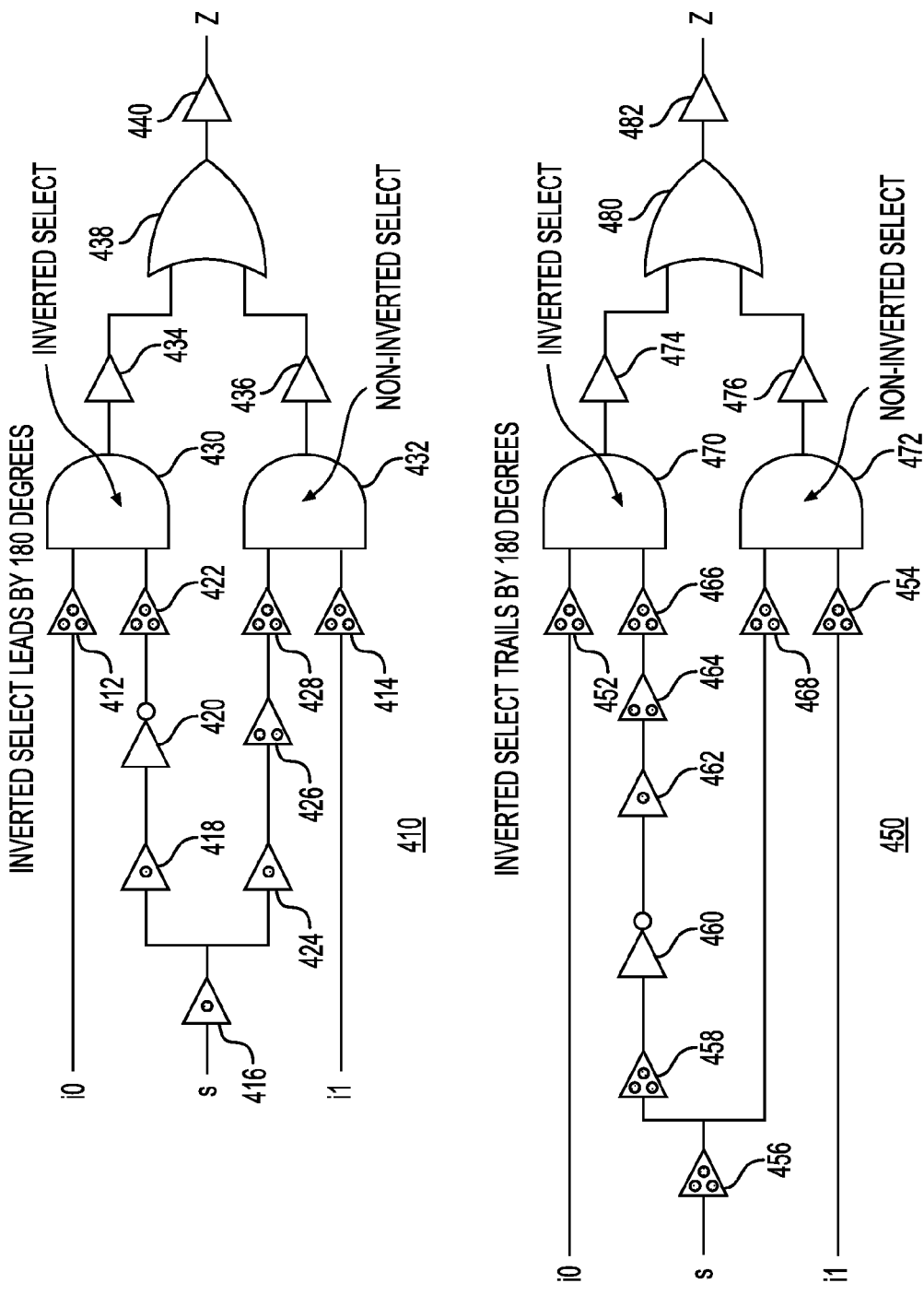
FIG. 4 shows diagrams of examples of 2-to-1 multiplexors using the phase-mode logic inverter.

FIG. 4 shows diagrams of examples of 2-to-1 multiplexors 400 using the phase-mode logic inverter. Each one provides 2-to-1 multiplexing, but may handle the phase offset created by the phase-mode logic inverter differently. 2-to-1 multiplexor 410 may receive inputs i0 and i1 and a select input (s). Input i0 may be coupled to a JTL 412. Input i1 may be coupled to a JTL 414. Select input (s) may be coupled to a JTL 416 and may be split into two paths using a splitter (not shown). One path may include a JTL 418, a phase-mode logic inverter 420, and a JTL 422. The other path may include JTLs 424, 426, and 428. These inputs may further be coupled to respective AND gates 430 and 432. The outputs of AND gates 430 and 432 may be coupled to the inputs of an OR gate 438 via JTLs 434 and 436. The output Z may be provided via JTL 440. In the top example, one of the select input (s) may have a certain phase and additional JTL elements may be added to the non-inverted select input (s) to phase align all of the inputs to AND gates 430 and 432. In this example, the inverted select may always lead the non-inverted select by 180 degrees. Thus, in this example, AND gate 430 connected to the inverted select may become transparent or opaque one half resonator clock cycle before the opposite change happens on AND gate 432 connected to the non-inverted input. 2-to-1 multiplexor 450 may receive inputs i0 and i1 and a select input (s). Input i0 may be coupled to a JTL 452. Input i1 may be coupled to a JTL 454. Select input (s) may be coupled to a JTL 456 and may be split into two paths using a splitter (not shown). One path may include a JTL 458, a phase-mode logic inverter 460, and JTLs 462, 464, and 466. The other path may include a JTL 468. These inputs may further be coupled to respective AND gates 472 and 474. The outputs of AND gates 470 and 472 may be coupled to the inputs of an OR gate 480 via JTLs 474 and 476. The output Z may be provided via JTL 482. The dots shown as part of JTLs represent 90 degrees of phase; thus, for example, no dot represents 0 degrees, one dots represents 90 degrees, two dots represent 180 degrees, and three dots represent 270 degrees. This convention is used not only as part of this figure, but in some other figures, as well. In the bottom example, the JTL elements may instead be placed on the inverted select causing the inverted select to always trail by 180 degrees and also to allow a later arrival at the select input. Although FIG. 4 shows a certain number of components of 2-to-1 multiplexors 400 arranged in a certain manner, there could be more or fewer number of components arranged differently.

Figure 5:
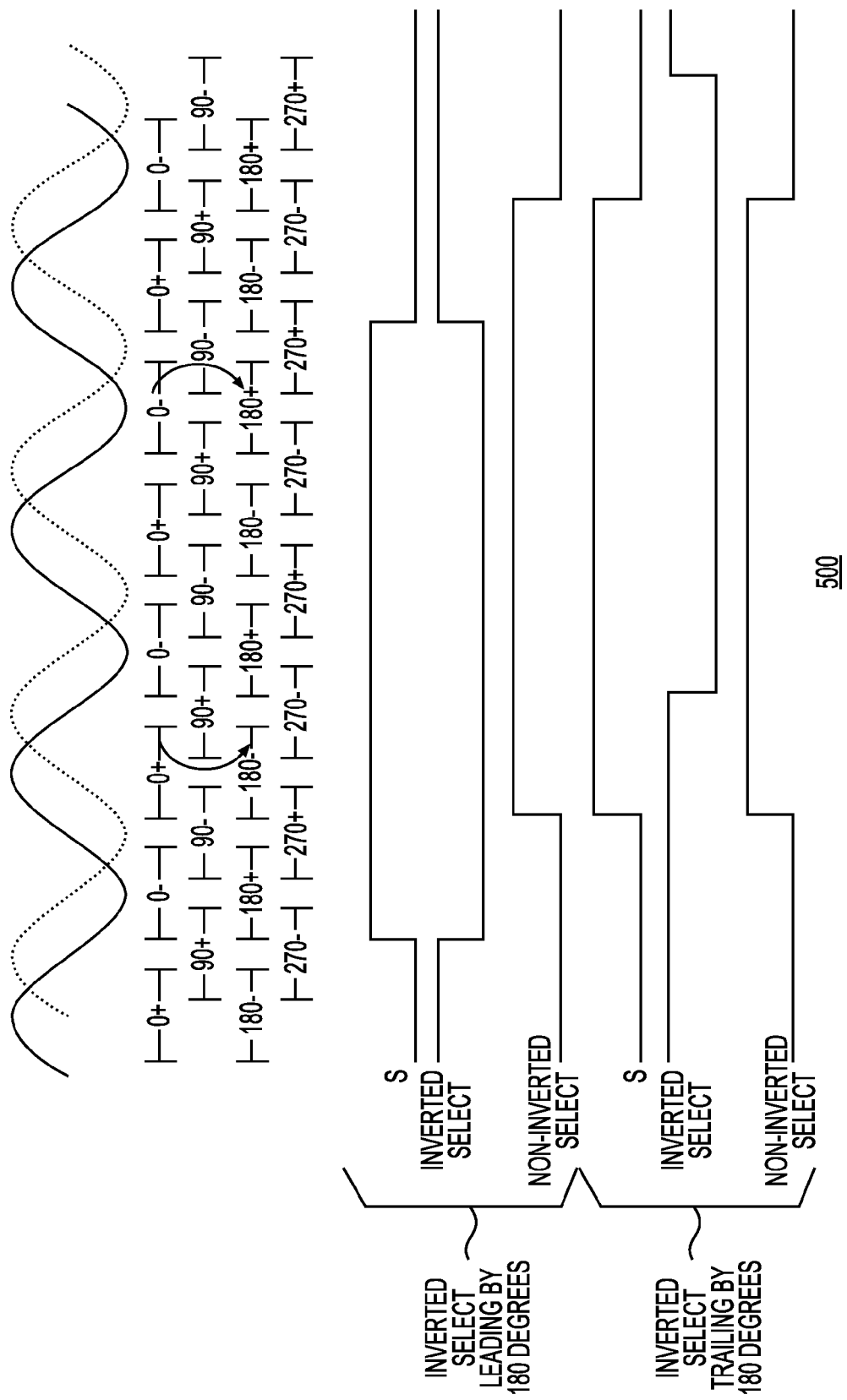
FIG. 5 shows waveforms for the select signal for the 2-to-1 multiplexors in relation to the resonator clocks in accordance with one example.

FIG. 5 shows exemplary waveforms 500 for the select signal (s) in relation to the resonator clocks. The select waveforms for both examples illustrate how each of the 2-to-1 multiplexors yield the same non-inverted select waveform, but the inverted select waveforms differ by a full resonator clock cycle.

Figure 6:
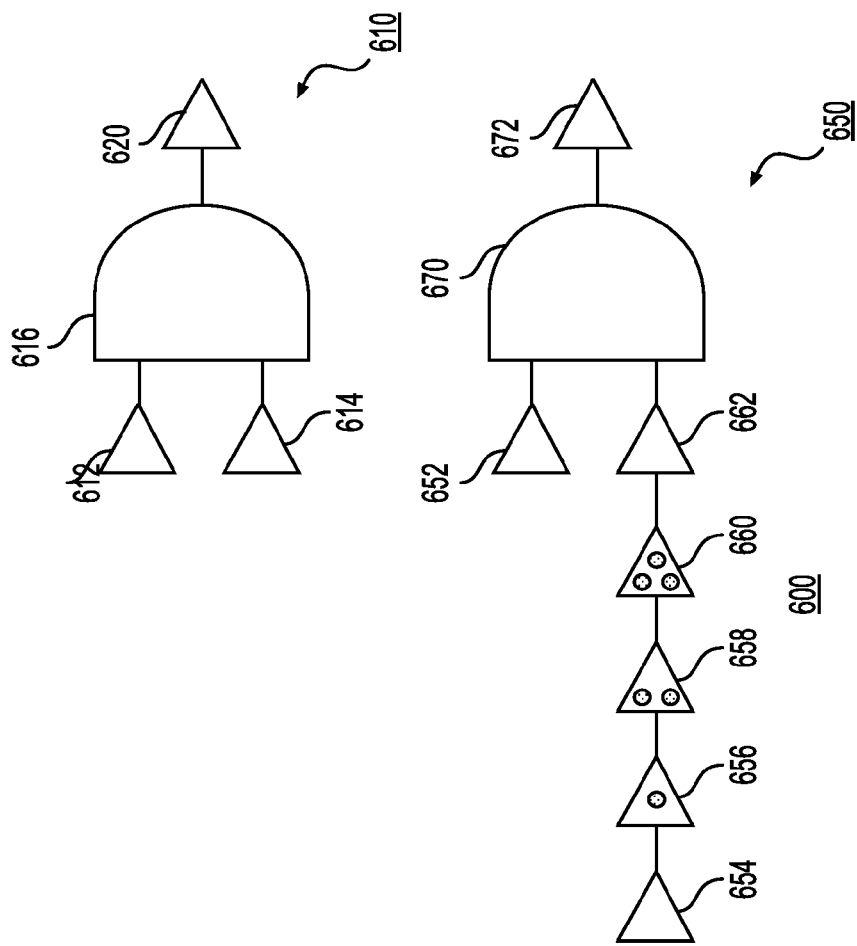
FIG. 6 shows examples of phase-mode logic circuits that are logically equivalent, but have different timing.

FIG. 6 shows examples of phase-mode logic circuits 610 and 650 that are logically equivalent, but have different timing. Because the Josephson junction (JJ) phase is persistent across the resonator clock cycles, the SFQ pulses may arrive at the respective gates on different resonator clock cycles, but still produce logically equivalent results. As an example, phase-mode logic circuit 610 may include two inputs, each coupled to a JTL (JTL 612 and 614, respectively). Each of the output of each of these JTLs is further coupled to a respective input of an AND gate 616. The output of AND gate 616 is provided to a JTL 620. As an example, phase-mode logic circuit 650 may include two inputs, one coupled to a JTL 652 and the other coupled to JTLs 654, 656, 658, 660, and 662. Each of the output of each of these respective set of JTLs is further coupled to a respective input of an AND gate 670. The output of AND gate 670 is provided to a JTL 672. In a wave-pipelined RQL design, the extra four phases of delay in phase-mode logic circuit 650 (with multiple JTLs) would cause these two circuits to be functionally different. In phase-mode, however, they are logically equivalent; the only difference being that phase-mode circuit 650 has a longer propagation delay than phase-mode circuit 610.

Although FIG. 6 shows a certain number of components of each of phase-mode logic circuits 610 and 650 arranged in a certain manner, there could be more or fewer number of components arranged differently. As an example, additional components may be added to make these phase-mode logic circuits more robust. The various examples of combinational logic circuits discussed earlier may suffer from glitches because of at least two reasons. First, the 180 degrees offset between positive pulses and negative pulses may result in glitches. Second, allowing the signals to arrive at the logic gates in different resonator clock cycles may also result in glitches. In one example, each of these causes of glitches may be resolved by leveraging the persistent nature of the phase-encoded data in the phase-mode logic family. In one example, the inputs to a phase-mode combinational logic circuit may be held constant long enough (e.g., for multiple resonator clock cycles), such that all pulses may propagate fully through the circuit and this way the circuit may advantageously reach steady state. In addition, in one example, if the outputs may only be sampled and released to the next stage after the circuit has reached steady state, the glitches caused by the previously discussed two reasons may advantageously be removed. As an example, two modifications may be made to RQL based circuits. First, a logical clock that is a return-to-zero encoded signal may be asserted every Nth resonator clock cycle (where in one example, N 2). The value of N may be a function of the logic depth. In this way, this logical clock may be used as the sample strobe to capture the steady state value of the phase-mode logic circuit and release it into the next stage. In such examples, the logical signal may be distributed via a balanced tree network such that it arrives at all endpoint in the same resonator clock cycle. As an example, the balanced tree network may include a binary splitter network at the clock source. Although in most examples, the logical clock signal may be distributed via a balanced tree network, it is not strictly required. Instead, an unbalanced network may be used, provided, however that the data at the data input (D) of each flip-flop is stable when the clock signal arrives at a respective flip-flop. The balanced tree network may further include passive transmission lines (PTLs) to deliver the clock to various regions of a device. At the other end of each of the PTLs, there may be an additional binary splitter network to handle local clock distribution. In certain complex circuit examples, the structure may include multiple levels of PTLs and corresponding binary splitter networks. In addition, in certain instances, the tree network may include JTLs or a combination of JTLs and PTLs. Second, the distributed logical clock may be combined with flip-flops, such that the inputs to each stage of the phase-mode logic may be held constant for an entire logical clock cycle. This may allow the phase-mode logic circuits to reach steady state before receiving any additional inputs.

Figure 7:
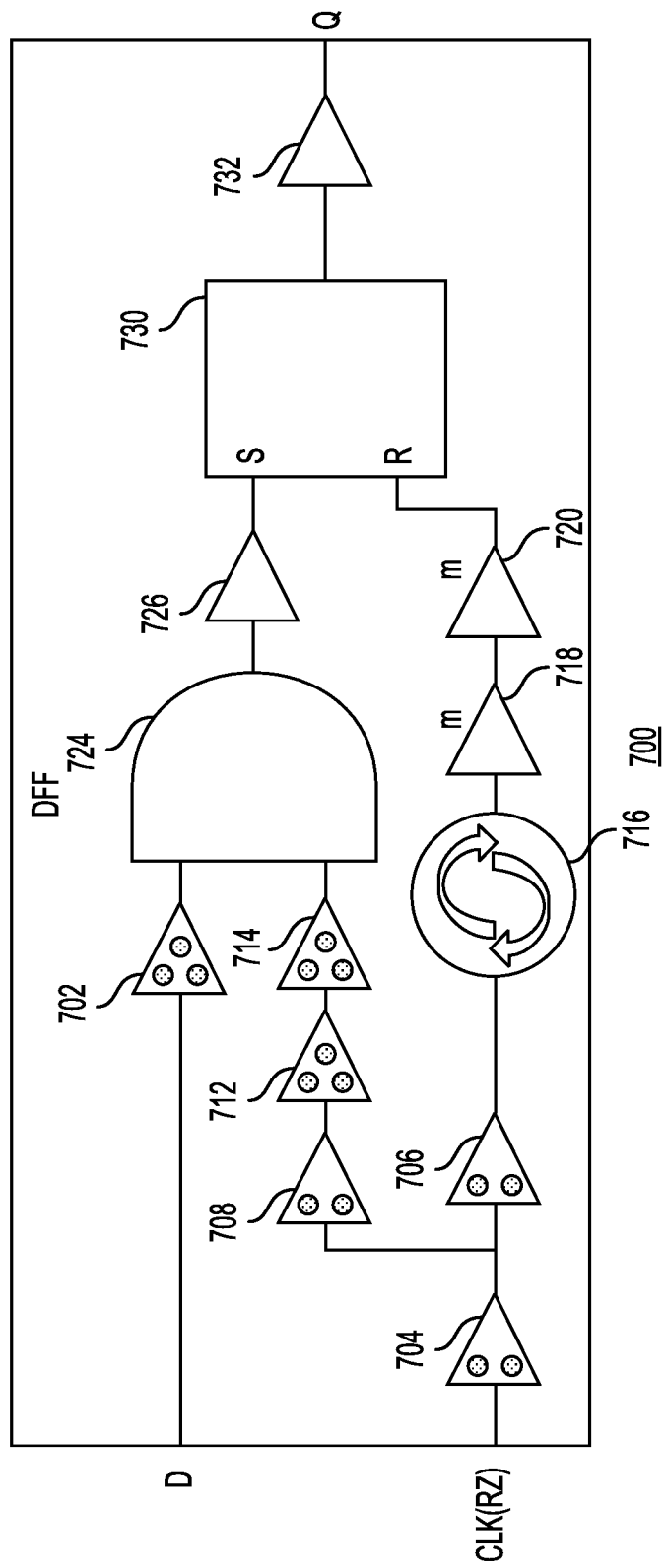
FIG. 7 shows a diagram of a phase-mode logic D flip-flop in accordance with one example.

FIG. 7 shows a diagram of a phase-mode logic D flip-flop 700 in accordance with one example. D flip-flop 700 may receive an input D, which may be coupled, via JTL 702, to a first input of an AND gate 724. D flip-flop 700 may further receive a return-to-zero clock signal (CLK(RZ)), which may be coupled to a second input of AND gate 724 via JTLs 704, 708, 712, and 714. The output of AND gate 724 may be coupled, via a JTL 726, to the set input (S) of SR-latch 730. The return-to-zero clock signal (CLK(RZ)) may be coupled, via a JTL 706, to a flip gate 716. The output of flip gate 716 may further be coupled, via JTLs 718 and 720, to the reset input (R) of SR-latch 730. The "m" next to JTLs 718 and 720, in FIG. 7, indicates that the internal DC bias in these JTLs is reversed in relation to the internal DC bias in the other JTLs. This convention is used in other figures, as well, that include JTLs with a reversed internal DC bias. When a positive pulse arrives at the CLK(RZ) input, it may go through flip gate 716 and thus may reset SR-latch 730. If the previous state of the latch was a logical '1,' this may produce a negative pulse at the Q output. The positive pulse from the clock may simultaneously be coupled, via JTLs 704, 708, 712, and 714 (which may act as a shift register), to one input of AND gate 724. If a positive pulse has previously arrived at the D input, in this or any previous resonator clock cycle, the positive pulse from the clock may pass through and set SR-latch 730 producing a positive pulse at the output Q, effectively writing a logical '1' to the flip-flop. If no positive pulse has arrived as the input D, AND gate 724 may not pass the positive clock pulse and SR-latch 730 may remain reset, effectively writing a logical '0' to the flip-flop. Two phases later, a reciprocal pulse may arrive on the clock, ensuring that AND gate 724 will not allow any incoming data inputs to affect SR-latch 730 until the next clock. The reciprocal pulse (e.g., a negative SFQ pulse) may have no effect on the latch itself. Although FIG. 7 shows a certain number of components of phase-mode logic D flip-flop 700 arranged in a certain manner, there could be more or fewer number of components arranged differently.

Figure 8:
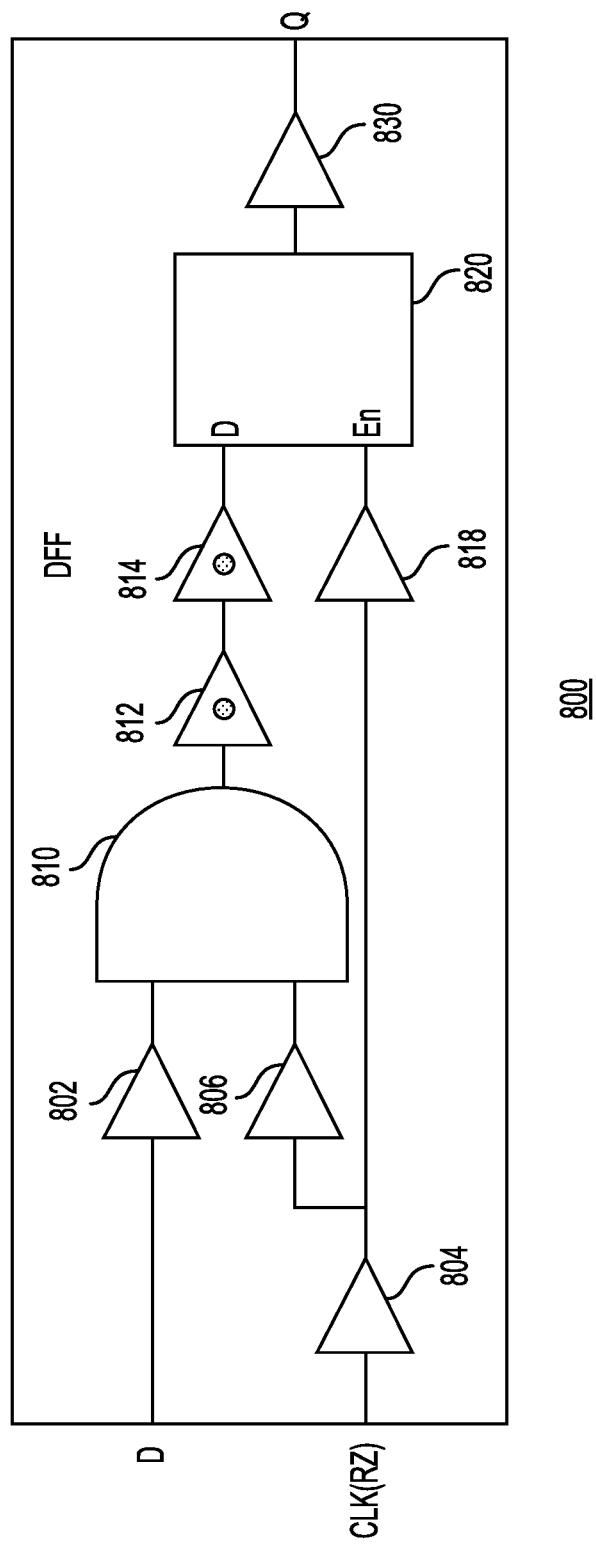
FIG. 8 shows a diagram of a phase-mode logic D-latch based D flip-flop in accordance with one example.

Referring now to FIG. 8, another example of a D flip-flop is shown. D-latch based D flip-flop 800 may include an input D, coupled via a JTL 802 to a first input of an AND gate 810. D-latch based flip-flop 800 may further receive a return-to-zero clock signal (CLK(RZ)), which may be coupled to a second input of AND gate 810 via JTLs 804 and 806. The output of AND gate 810 may be coupled, via JTLs 812 and 814 to the D input (D) of D-latch 820. The return-to-zero clock signal (CLK(RZ)) may be coupled, via JTLs 804 and 818, to the enable input (En) of D-latch 820. The output of D-latch 820 may further be coupled to JTL 830 to provide an output (Q). Similar, to D flip-flop 700 of FIG. 7, D-latch based D flip-flop 800 may provide flip-flop functionality for use in phase-mode logic combinational logic circuits. Both examples of D flip-flops shown in FIG. 7 and FIG. 8, respectively may exhibit an undesirable behavior. Each of these may sometimes glitch at their output when both the current state and the next state of the input are the same. While this does not make these D flip-flops un-useable, it may introduce extra pulses and thus extra power dissipation into the system.

Figure 9:
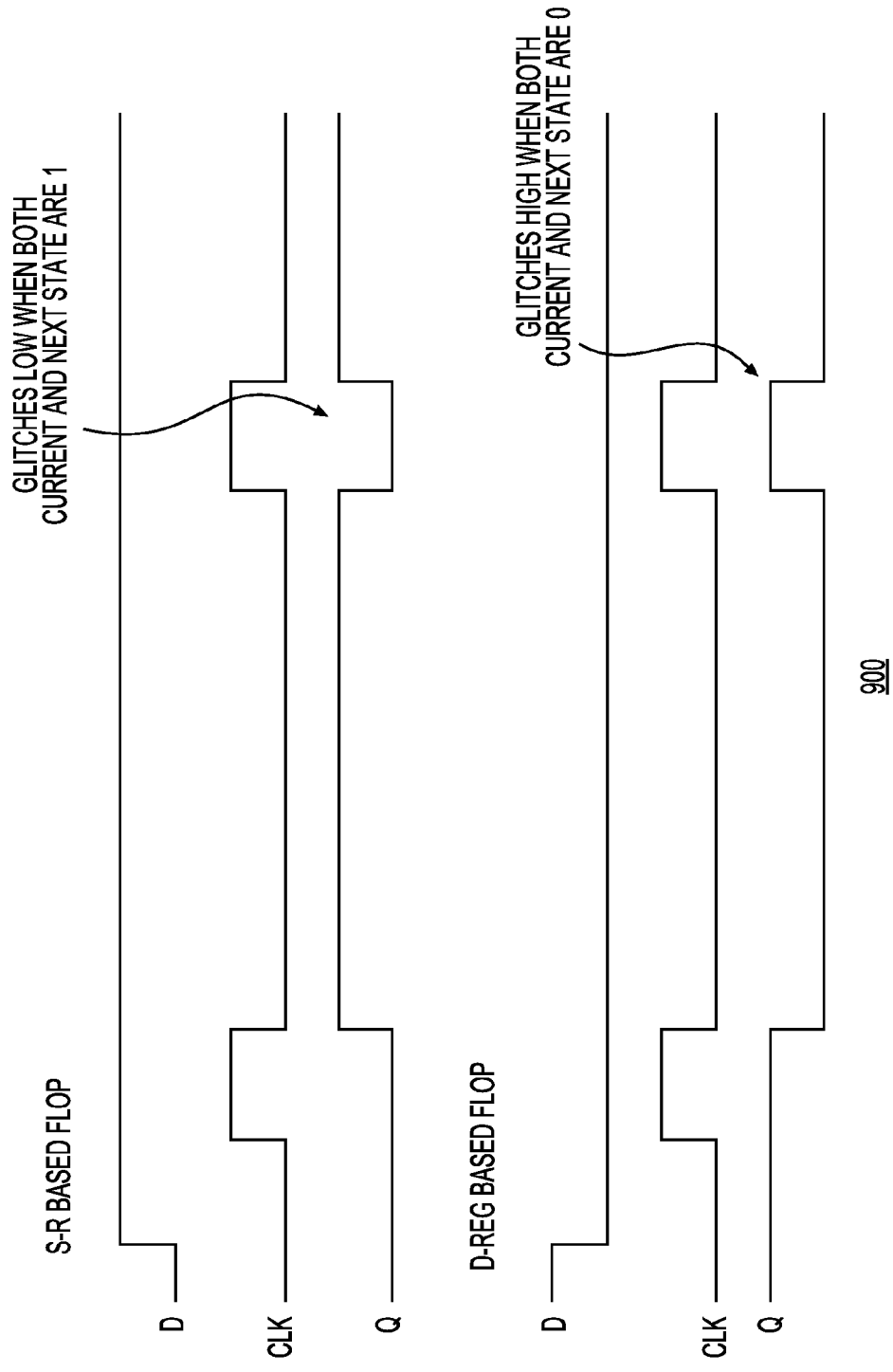
FIG. 9 illustrates the glitches in certain examples of phase-mode logic circuits via a timing diagram.

FIG. 9 illustrates the glitches via a timing diagram 900. With respect to D flip-flop 700, as shown in the top portion of timing diagram 900, input D does not change from a current state to the next state (e.g., it stays at logic '1'). The output Q may glitch (change from logic '1' to logic '0' momentarily) even though input D has not changed. Similarly, with respect to D-latch based D flip-flop 800, as shown in the bottom portion of timing diagram 900, input D does not change from a current state to the next state e.g., it stays at logic '0.' The output Q may glitch (change from logic '0' to logic '1' momentarily) even though the input D has not changed.

Figure 10:
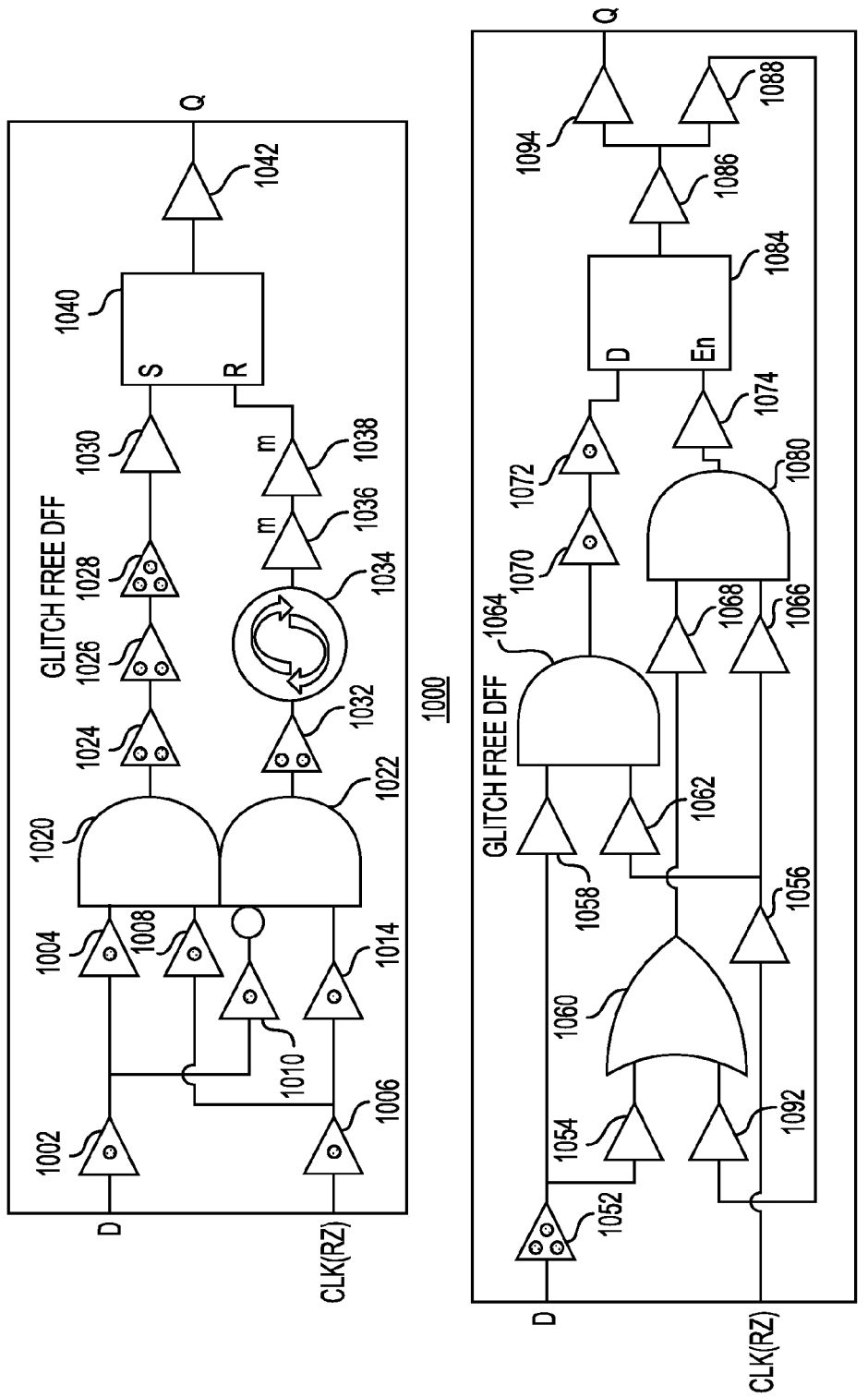
FIG. 10 shows a diagram of a phase-mode logic glitch-free D flip-flop in accordance with one example, and a diagram of a phase-mode logic glitch-free D flip-flop, based on a D-latch, in accordance with one example.

Examples of phase-mode logic D flip-flop circuits may be modified to suppress the glitches. Suppressing the glitches may advantageously reduce the number of pulses generated in a phase-mode logic circuit when state elements in the phase-mode logic circuit maintain state across several logical clock cycles. FIG. 10 shows a diagram of a phase-mode logic glitch-free D flip-flop (Glitch-Free DFF) 1000 in accordance with one example, and a diagram of a phase-mode logic glitch-free D-latch based D-flip flop (Glitch-Free DDFF) 1050 in accordance with one example. Glitch-Free DFF 1000 may receive an input D, which may be coupled, via JTLs 1002 and 1004, to a first input of an AND gate 1020. The input D may further be split and coupled via JTL 1010 to a first input of an A-and-not-B gate 1022. Glitch-Free DFF 1000 may further receive a return-to-zero clock signal (CLK(RZ)), which may be coupled to a second input of AND gate 1020 via JTLs 1006 and 1008. The output of AND gate 1020 may be coupled, via JTLs 1024, 1026, 1028, and 1030, to the set input (S) of SR-latch 1040. The return-to-zero clock signal (CLK(RZ)) may further be split and coupled via JTLs 1006 and 1014 to a second input of A-and-not-B gate 1022. The output of A-and-not-B gate 1022 may be coupled, via a JTL 1032, to a flip gate 1034. The output of flip gate 1034 may further be coupled, via JTLs 1036 and 1038, to the reset input (R) of SR-latch 1040. In terms of operation, Glitch-Free DFF 1000 may provide a similar function in a similar way as D flip-flop 700. However, an A-and-not-B gate 1022 may be inserted to suppress the resetting of the latch when the next state to be written is a logical '1.'

With continued reference to FIG. 10, in accordance with one example, a simpler version of Glitch-Free D-latch based D flip-flop (Glitch-Free DDFF) 1050 is shown. Glitch-Free DDFF 1050 may include an input, coupled via JTLs 1052 and 1058, to a first input of an AND gate 1064. The input D may be split after JTL 1052. In this way, input D may further be coupled via a JTL 1054 to a first input of an OR gate 1060. Glitch-Free DDFF 1050 may further receive a return-to-zero clock signal (CLK(RZ)), which may be coupled to a second input of AND gate 1064 via JTLs 1056 and 1062. The return-to-zero clock signal (CLK(RZ)) may be split after JTL 1056. In this way, the return-to-zero clock signal (CLK(RZ)) may further be coupled, via a JTL 1066, to a first input of an AND gate 1080. The output of OR gate 1060 may further be coupled to the second input of AND gate 1080 via a JTL 1068. The output of AND gate 1064 may be coupled, via JTLs 1070 and 1072 to the input D of D-latch 1084. The output of AND gate 1080 may be coupled, via JTL 1074, to the enable input (En) of D-latch 1084. The output of D-latch 1084 may further be coupled to JTL 1086 and further be split, with one split signal, via a JTL 1094, provided as output (Q). The other split signal may be fed back to OR gate 1060 via JTLs 1088 and 1092. Similar, to Glitch-Free DFF 1000, Glitch-Free DDFF 1050 may provide flip-flop functionality for use in phase-mode logic combinational logic circuits. In this example, Glitch-Free DDFF 1050 (a D-Latch based design) may require knowledge of both the next state and the previous one. In this modified example, the enable may be suppressed when both the current state and next state are logical '0.' Although FIG. 10 shows a certain number of components of each of phase-mode logic Glitch-Free DDFF 1000 and Glitch-Free DFF 1050 arranged in a certain manner, there could be more or fewer number of components arranged differently.

Figure 11:
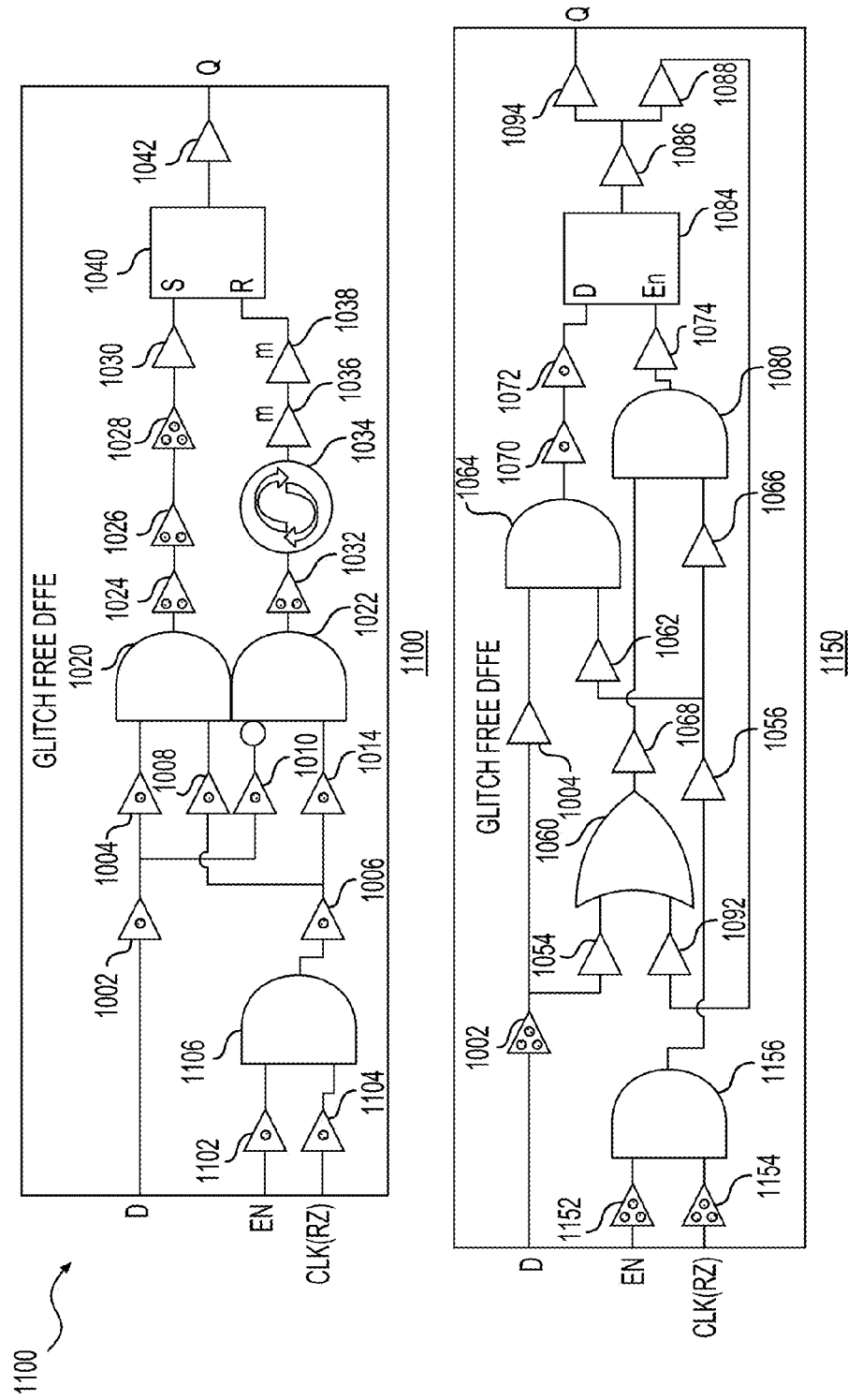
FIG. 11 shows a diagram of a phase-mode logic glitch-free D flip-flop with an enable control in accordance with one example, and a diagram of a phase-mode logic glitch-free D flip-flop, based on a D-latch, with an enable control in accordance with one example.

FIG. 11 shows a diagram of a phase-mode logic glitch-free D flip-flop with an enable control (Glitch-Free E-DFF) 1100 in accordance with one example, and a diagram of a phase-mode logic glitch-free D flip-flop, based on a D-latch, with an enable control (Glitch-Free E-DDFF) 1150 in accordance with one example. In these examples, the enable control is added to suppress the clock to the examples of D flip-flop circuits discussed earlier, for example, Glitch-Free DFF 1000 and Glitch-Free DDFF 1050 of FIG. 10. As an example, Glitch-Free E-DFF 1100 may include an enable control (EN), coupled via JTL 1102, to a first input of an AND gate 1106. The return-to-zero clock signal (CLK(RZ)) may be coupled, via JTL 1104, to a second input of AND gate 1106. In this manner, when the enable control is logic '0' no clock signal may pass through AND gate 1106. The remaining components of Glitch-Free E-DFF 1100 are the same as those in Glitch-Free DFF 1000. In addition, they may perform similar functions as described above with respect to FIG. 10. Similarly, as an example, Glitch-Free E-DDFF 1150 may include an enable control (EN), coupled via JTL 1152, to a first input of an AND gate 1156. The return-to-zero clock signal (CLK(RZ)) may be coupled, via JTL 1154, to a second input of AND gate 1156. In this manner, when the enable control is logic '0' no clock signal may pass through AND gate 1106. The remaining components of Glitch-Free E-DDFF 1150 are the same as those in Glitch-Free DFF 1050. In addition, they may perform similar functions as described above with respect to FIG. 10. In the example phase-mode logic circuits shown in FIG. 11, clock-gating related issues may not require any additional circuitry because of the 180 degrees out of phase propagation of the positive pulses and the negative pulses through such circuits. Although FIG. 11 shows a certain number of components of each of phase-mode logic Glitch-Free E-DFF 1100 and Glitch-Free E-DDFF 1150 arranged in a certain manner, there could be more or fewer number of components arranged differently.

Figure 12:
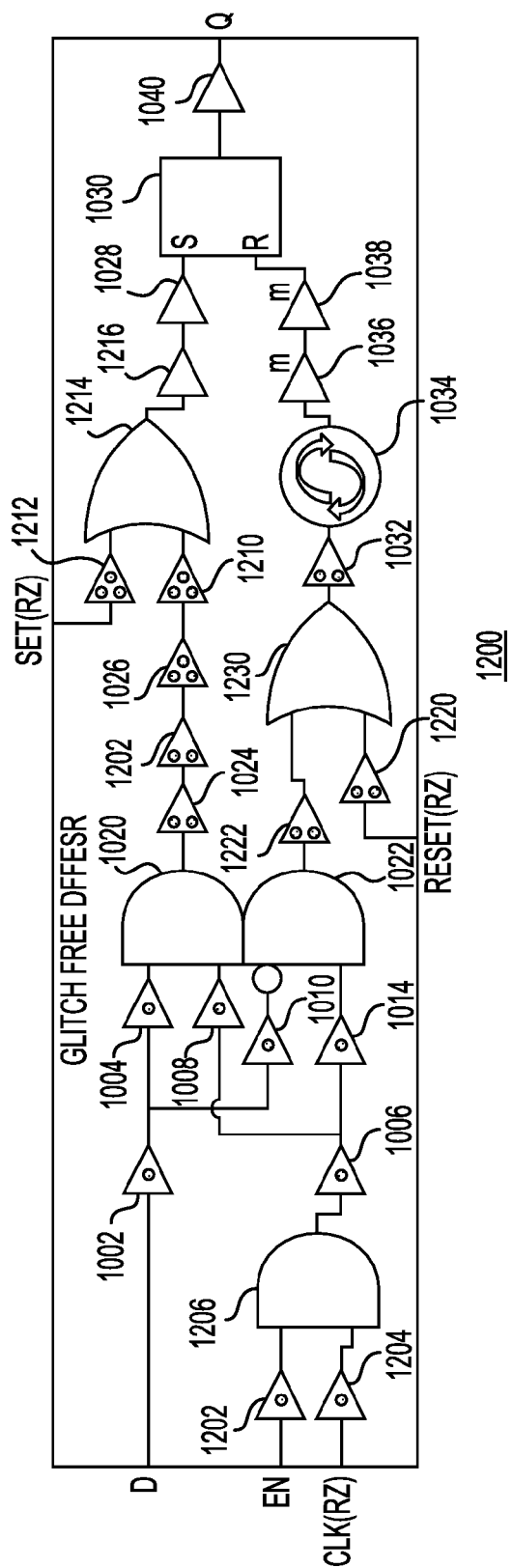
FIG. 12 shows a diagram of a phase-mode logic glitch-free, SR-latch based, D flip-flop with an enable control in accordance with one example.

FIG. 12 shows a diagram of a phase-mode logic glitch-free, SR-latch based, D flip-flop with an enable control (EN) 1200 in accordance with one example. In this example, the enable control may be added to suppress the clock to the examples of D flip-flop circuits discussed earlier, for example, Glitch-Free DFF 1000 of FIG. 10. As an example, Glitch-Free E-DFF 1200 may include an enable control (EN), coupled via JTL 1202, to a first input of an AND gate 1206. The return-to-zero clock signal (CLK(RZ)) may be coupled, via JTL 1204, to a second input of AND gate 1206. In this manner, when the enable control is logic '0' no clock signal may pass through AND gate 1206. In addition to the enable control, additional control signals, including SET (RZ) and RESET(RZ) may be added, as shown in FIG. 12. The SET(RZ) signal may be a return-to-zero signal and it may be coupled, via JTL 1212, to an input of an OR gate 1214. Additional JTLs 1202 and 1210 may be provided at the output path of AND gate 1020. In this manner, the output of AND gate 1020 may be coupled to the second input of OR gate 1214. The output of OR gate 1214 may be coupled, via JTLs 1216 and 1028, to the set input (S) of SR latch 1030. The RESET(RZ) signal may be a return-to-zero signal and it may be coupled, via JTL 1220, to an input of an OR gate 1230. Additional JTL 1222 may be provided at the output path of A-and-not-B gate 1022. In this manner, the output of A-and-not-B gate 1022 may be coupled to the second input of OR gate 1230. The output of OR gate 1214 may be coupled, via flip gate 1036 and 1038, to the reset input (R) of SR latch 1030. The remaining components of Glitch-Free E-DFFSR 1200 may be the same as those in Glitch-Free DFF 1050. In addition, they may perform similar functions as described above with respect to FIG. 10. Because in the example of Glitch-Free E-DFFSR 1200 each of the set/reset signals (SET(RZ) and RESET(RZ) go directly into the respective S or R input of the SR-latch, each of these signals is encoded as a return-to-zero signal. In addition, to ensure proper operation of Glitch-Free E-DFFSR 1200, the clock signal may be provided to Glitch-Free E-DFFSR 1200 in a manner that the clock signal does not arrive too close to the arrival of set or reset signals. As an example, a series of flip-flops (e.g., Glitch-Free E-DFFSR 1200) may be connected to form a larger phase-mode logic circuit. Although FIG. 12 shows a certain number of components of Glitch-Free E-DFFSR 1200 arranged in a certain manner, there could be more or fewer number of components arranged differently.

Figure 13:
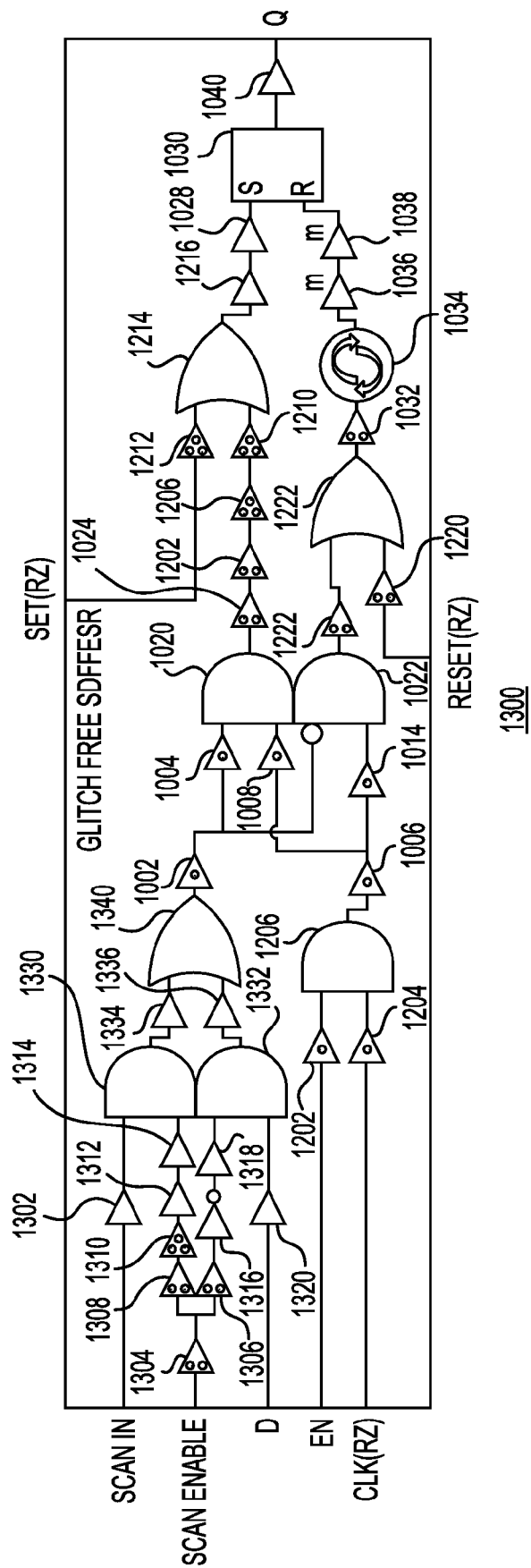
FIG. 13 shows a diagram of a phase-mode logic scan flip-flop in accordance with one example.

FIG. 13 shows a diagram of a phase-mode logic scan flip-flop 1300 in accordance with one example. Scan flip-flop 1300 may include a 2-to-1 multiplexor (e.g., similar to as described with respect to FIG. 4) and a Glitch-Free E-DFFSR 1200 (as shown in FIG. 12). Scan flip-flop 1300 may be used for testing the functionality of the various phase-mode logic circuits included as part of a device (e.g., a processor, a controller, or another type of device). When the control input SCAN ENABLE is logic '1,' scan flip-flop 1300 may process the input SCAN IN, instead of the input D. Alternatively, when the control input SCAN ENABLE is '0,' scan flip-flop may process D input and perform like Glitch-Free E-DFFSR 1200. The 2-to-1 multiplexor added at the input side of scan flip-flop 1300 (e.g., to the left of Glitch-Free E-DFFSR 1200) may allow, under the control of SCAN ENABLE signal, the processing of either the input SCAN IN or the input D. Input SCAN IN may be coupled to a JTL 1302. Input D may be coupled to a JTL 1318. Select input (SCAN ENABLE) may be coupled to a JTL 1304 and may be split into two paths. One path may include a JTL 1306, a phase-mode logic inverter 1318, and a JTL 1318. The other path may include JTLs 1308, 1310, 1312, and 1314. These inputs may further be coupled to respective AND gates 1330 and 1332. The outputs of AND gates 1330 and 1332 may be coupled to the inputs of an OR gate 1340 via JTLs 1334 and 1336, respectively. The output of 2-to-1 multiplexor may then be split and provided as inputs two AND gate 1020 and A-and-not-B gate 1022, respectively. The remaining components of scan flip-flop 1300 may be the same as those in Glitch-Free E-DFFSR 1200. In addition, they may perform similar functions as described above with respect to FIG. 12.

Although FIG. 13 shows a certain number of components of phase-mode logic based scan flip-flop 1300 arranged in a certain manner, there could be more or fewer number of components arranged differently. As an example, although not shown in FIG. 13, the test input through the input SCAN IN may be provided by an on-chip phase-mode logic, such as a random input generator. In this manner, a phase-mode logic device could be tested post-fabrication without the use of external diagnostic equipment.

Figure 14:
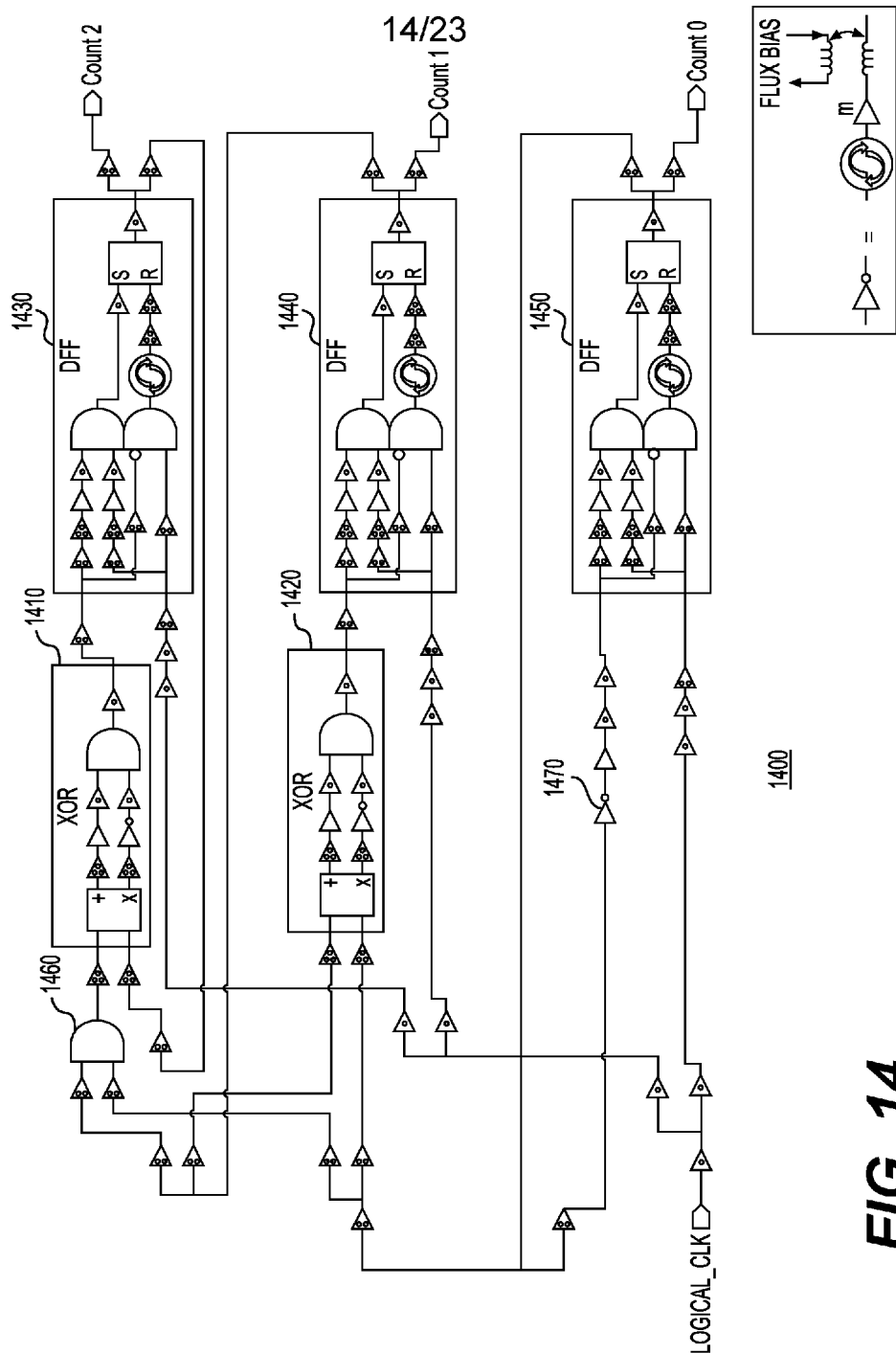
FIG. 14 shows a diagram of a three-bit counter that includes phase-mode logic circuits in accordance with one example.

Using the previously described phase-mode logic circuits, functional circuits that perform various functions may be created. As an example, FIG. 14 shows a diagram of a three-bit counter 1400 that includes phase-mode logic circuits. In one example, three-bit counter 1400 may include an exclusive OR (XOR) circuit 1410, another XOR circuit 1420, a D flip-flop 1430, a second D flip-flop 1440, a third D flip-flop 1450, an AND gate 1460, a phase-mode logic inverter 1470, and multiple JTLs. Phase-mode logic inverter 1470 may be implemented as shown in FIG. 14. Additional details regarding the phase-mode logic inverter are provided with respect to FIG. 20. In one example, these components may be coupled in the manner shown in FIG. 14. In one example, each of the D flip-flops (1430, 1440, and 1450) may be any of the D flip-flops (e.g., FIG. 7) as described earlier. The flip-flops may be clocked with a return-to-zero clock (CLK(RZ)), as described previously. D flip-flop 1430 may produce the Count 2 output. D flip-flop 1440 may produce the Count 1 output. D flip-flop 1450 may produce the Count 0 output. Each clock pulse may make three-bit counter 1500 advance. With the JTLs, additional delay may be added to the input of the D flip-flops to ensure that the input to each of the D flip-flops is not sampled before it is stable. For example, as shown in FIG. 14, the clock received at the input D of each of the D flop-flops may be delayed in relation to the clock signal (labeled as LOGICAL_CLK). No minimum clock rate is required, as the clock pulses may be sent as slowly as desired. Each clock pulse may make the counter advance. According to one example, three-bit counter 1400 may run as fast as half the resonator clock frequency. Although FIG. 14 shows a certain number of components of three-bit counter 1400 arranged in a certain manner, there could be more or fewer number of components arranged differently.

Figure 15:
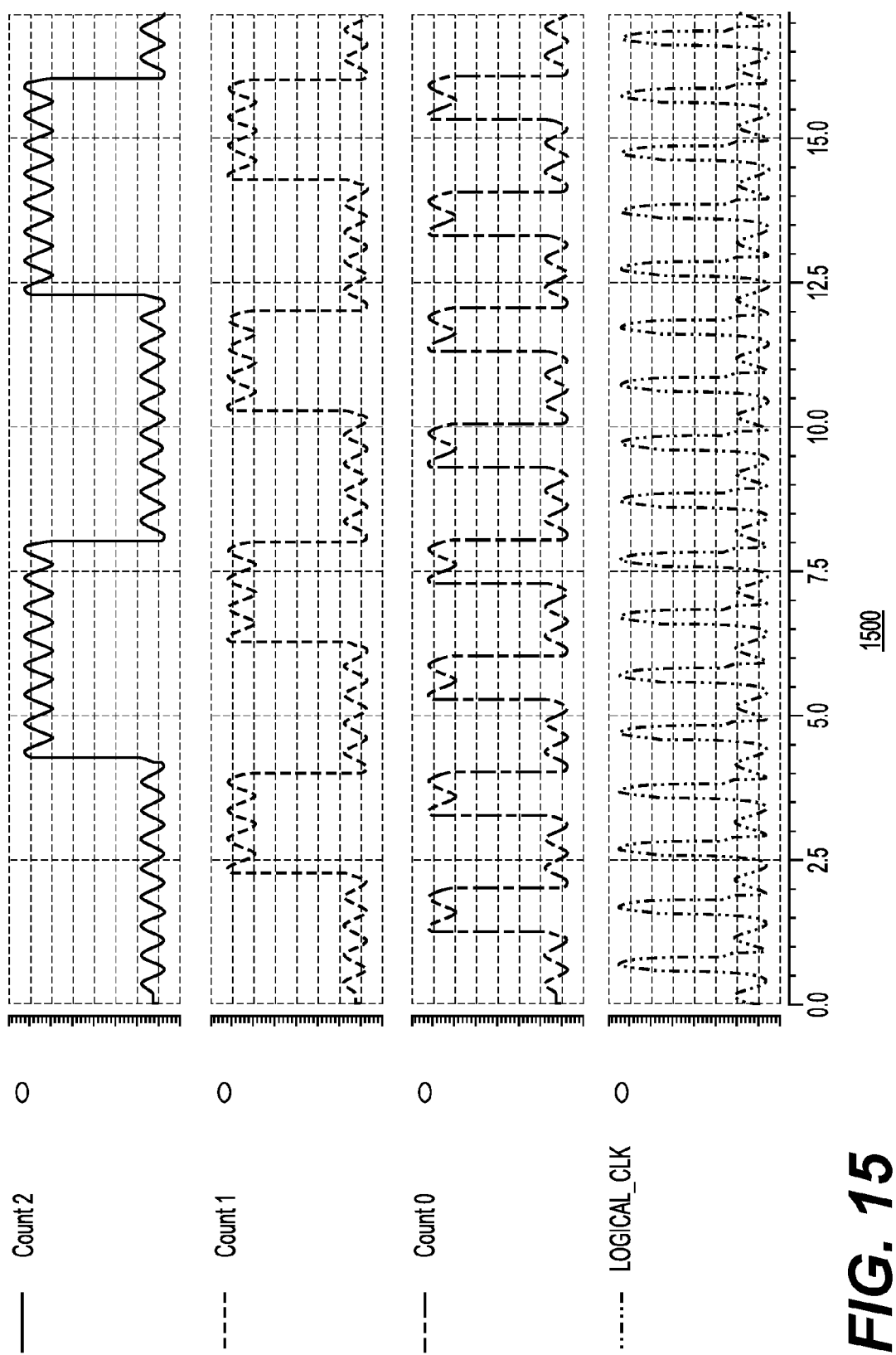
FIG. 15 shows the output waveforms of a three-bit counter in accordance with one example.

FIG. 15 shows the output waveforms 1500 of three-bit counter 1400 in accordance with one example. In this example, three-bit counter 1400 may run as fast as one-half the resonator clock frequency. Each tick of the logical clock (e.g. LOGICAL_CLK) may release one set of pulses from the outputs of each of the D flip-flops once it reaches a particular D flip-flop. Each of these pulses may filter through the circuit and arrive at the AND gate attached to the D input of the respective flip-flop. The results may wait here until the next clock pulse arrives to capture this value and release it back into the combinational system. Thus, for example, the first logical clock pulse may release an output pulse at the Count 0 output. A subsequent logical clock pulse may release an output pulse at the Count 1 output. Yet another subsequent logical clock pulse may release an output pulse at the Count 2 output. Three-bit counter 1400 may provide a binary count and may hold the state after the logical clock is no longer applied.

Figure 16:
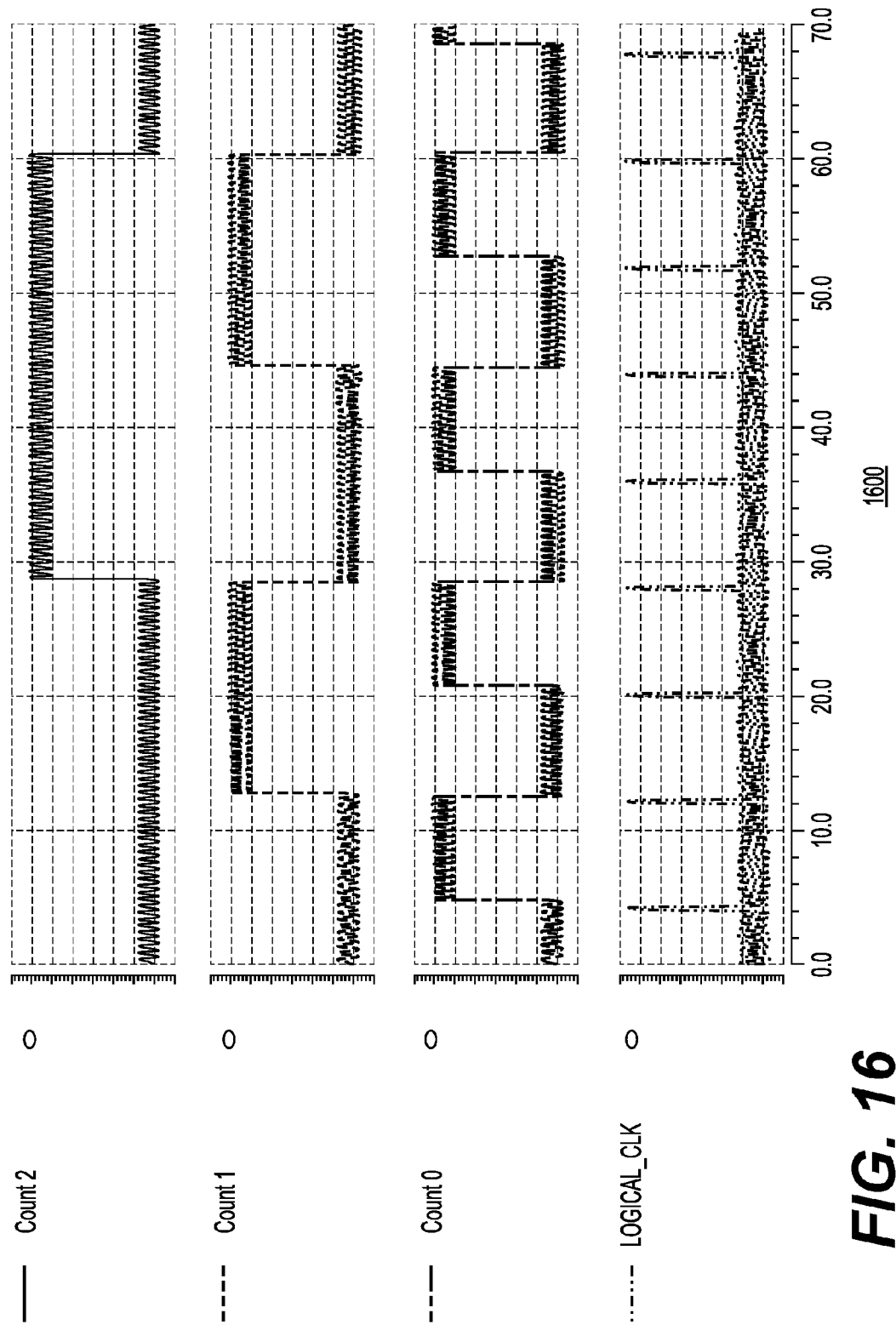
FIG. 16 shows the output waveforms of the three-bit counter in accordance with another example.

FIG. 16 shows the output waveforms 1600 of three-bit counter 1400 in accordance with another example. In this example, three-bit counter 1400 may run at a reduced logical clock (e.g., LOGICAL_CLK) rate, but at the same resonator clock frequency as the three-bit counter described with respect to FIG. 15. Each tick of the logical clock (e.g. LOGICAL_CLK) may release one set of pulses from the outputs of each of the D flip-flops once it reaches a particular D flip-flop. Each of these pulses may filter through the circuit and arrive at the AND gate attached to the D input of the respective flip-flop. The results may wait here until the next clock pulse arrives to capture this value and release it back into the combinational system. Thus, for example, the first logical clock pulse may release an output pulse at the Count 0 output. A subsequent logical clock pulse may release an output pulse at the Count 1 output. Yet another subsequent logical clock pulse may release an output pulse at the Count 2 output.

Figure 17:
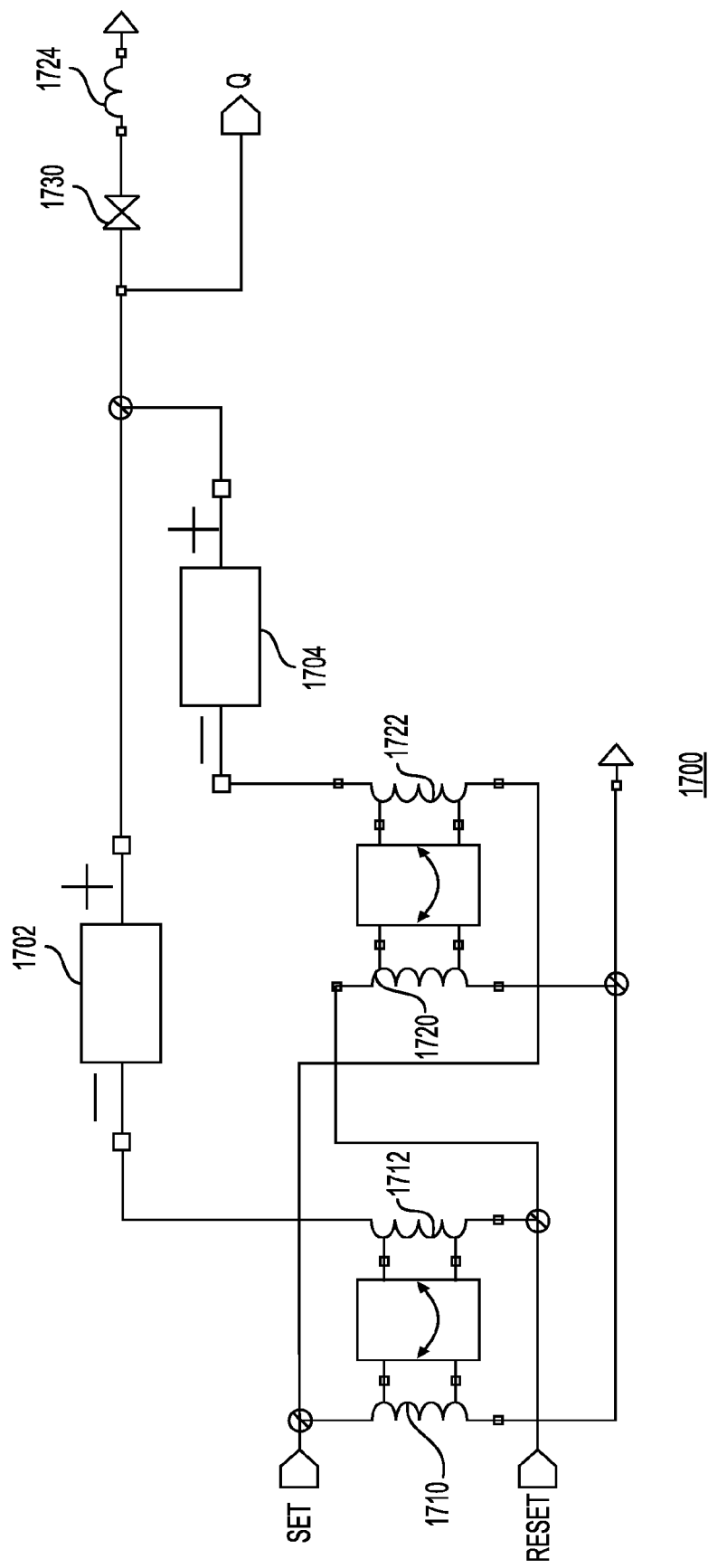
FIG. 17 shows a diagram of a SR-latch (based on the phase-mode logic) in accordance with one example.

FIG. 17 shows a diagram of a SR-latch 1700 (based on phase-mode logic) in accordance with one example. SR-latch 1700 may include a terminal for receiving the SET signal and another terminal for receiving the RESET signal. SR-latch may further include DC flux bias elements 1702 and 1704. Each of the DC flux bias elements may produce a direct current (DC) bias. SR-latch 1700 may further include inductors 1710, 1712, 1720, 1722, and 1724. Inductor 1710 may be coupled (inductively) to inductor 1712. Inductor 1720 may be coupled (inductively) to inductor 1722. Inductor 1724 may have two terminals, one of which may be coupled to ground and the other may be coupled to a Josephson junction 1730. Output Q may be coupled to the other end of Josephson junction 1730. In operation, a positive pulse arriving at the terminal for receiving the SET signal may cause Josephson junction 1730 to trigger. This, in turn, may cause a positive pulse at the output and may cancel the initial DC current set by DC flux bias elements 1702 and 1704. The reciprocal (negative) pulse arriving at the terminal for receiving the SET signal may cause a DC current that is equal and opposite to the initial current in DC flux bias elements 1702 and 1704. A negative pulse arriving at the terminal for receiving the RESET signal may cause Josephson junction 1730 to trigger in the opposite direction causing a negative pulse at the output and again cancelling the DC current in DC flux bias elements 1702 and 1704. The reciprocal (positive) pulse arriving at the terminal for receiving the RESET signal may return the DC current in DC flux bias elements 1702 and 1704 to the initial state.

Although FIG. 17 shows a certain number of components of SR-latch 1700 arranged in a certain manner, there could be more or fewer number of components arranged differently.

Figure 18:
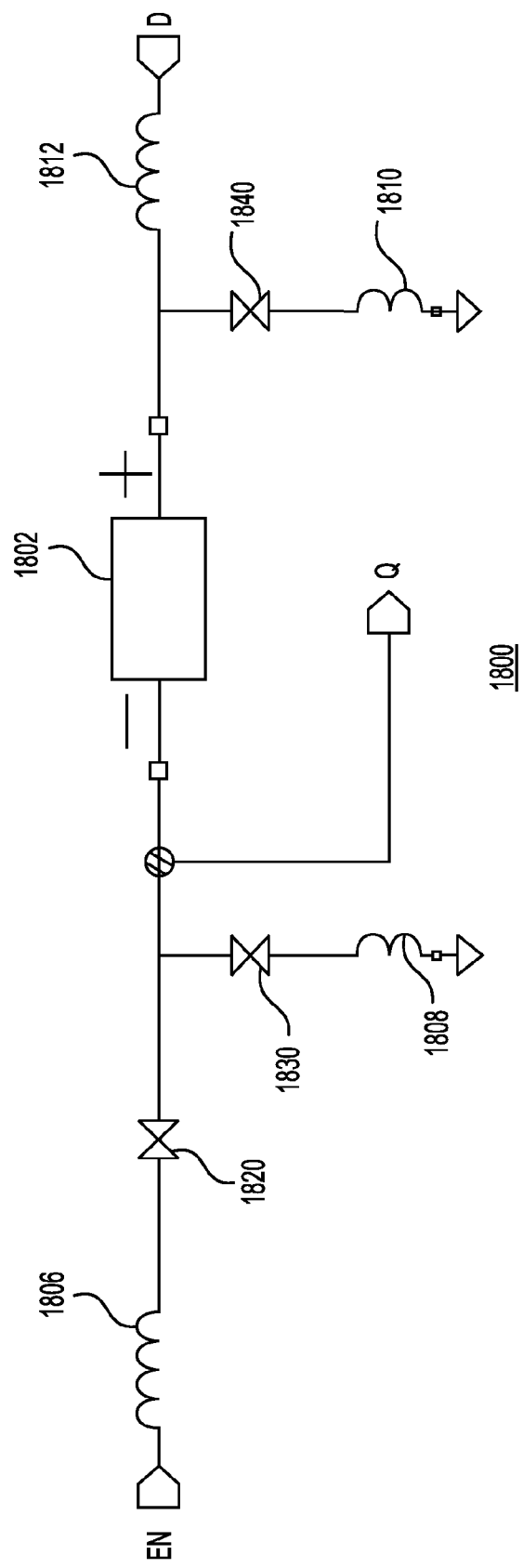
FIG. 18 shows a schematic diagram of a D-latch (based on the phase-mode logic) in accordance with one example.

FIG. 18 shows a diagram of a D-latch 1800 (based on phase-mode logic) in accordance with one example. D-latch 1800 may include a terminal for receiving the enable input (EN), a terminal for receiving the input D signal, and a terminal for providing the output (D) signal. D-latch may further include a DC flux bias element 1802, which may produce a direct current (DC) bias. D-latch 1800 may further include inductors 1806, 1808, 1810, and 1812. One terminal of inductor 1806 may be coupled to receive the enable input (EN) and the other terminal may be coupled to one terminal of a Josephson junction 1820. The other terminal of Josephson junction 1820 may be coupled to one terminal of Josephson junction 1830, the output (Q), and one terminal of DC flux bias element 1802. The other terminal of Josephson junction 1830 may be coupled to one terminal of inductor 1808. The other terminal of inductor 1808 may be coupled to ground. The other terminal of DC flux bias element 1802 may also be coupled to one terminal of Josephson junction 1840 and one terminal of inductor 1812. The other terminal of inductor 1812 may be coupled the terminal for receiving the input D signal. The other terminal of Josephson junction 1840 may be coupled to one terminal of inductor 1810. The other terminal of inductor 1810 may be coupled to ground. In operation, Josephson junction 1830 and 1840 may create a storage loop with one-half of flux quantum circulating in the loop in a clock wise direction, as a result of the application of the DC flux bias using DC flux bias element 1802. In addition, in operation, Josephson junction 1820 and Josephson junction 1830 may form a comparator because of the relative size of the two Josephson junctions. As an example, Josephson junction 1830 may be smaller than Josephson junction 1820. As a result, when a positive pulse arrives at the enable input (EN) the current flow into Josephson junction 1830 may exceed its critical current and thus trigger it. That may, in turn, generate a positive pulse at the output (Q). When a negative pulse arrives at the enable input (EN), if no pulse has arrived at the input (D), Josephson junction 1830 may trigger in an opposite direction and the output (Q) will go low. If a positive pulse arrives at input (D), before the negative pulse arrives at the enable input (EN), it may trigger Josephson junction 1840 reversing the direction of the DC current in the storage loop. Then when the negative pulse arrives at the enable input (EN), Josephson junction 1820 may trigger suppressing the negative pulse. The net effect may preserve the output (Q). In this way, any positive pulse at the input (D) may selectively block the effect of a negative pulse received at the enable input (EN).

Although FIG. 18 shows a certain number of components of D-latch 1800 arranged in a certain manner, there could be more or fewer number of components arranged differently.

Figure 19:
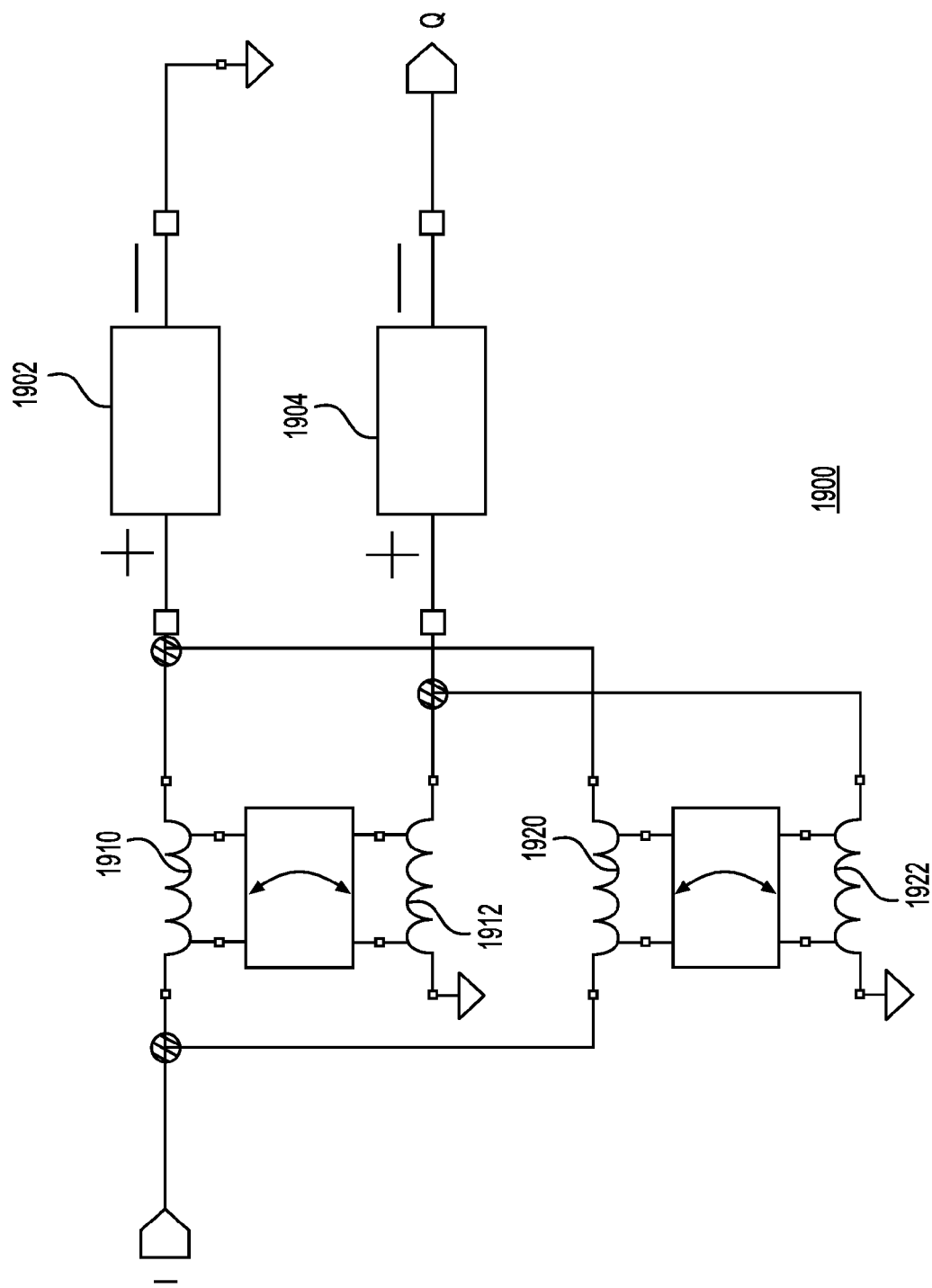
FIG. 19 shows a diagram of a flip gate (based on the phase-mode logic) in accordance with one example.

FIG. 19 shows a diagram of a flip gate 1900 (based on phase-mode logic) in accordance with one example. Flip gate 1900 may include DC flux bias elements 1902 and 1904. Each of the DC flux bias elements may produce a direct current (DC) bias. Flip gate 1900 may further include inductors 1910, 1912, 1920, and 1922. The input (I) may be coupled to one terminal of inductor 1910 and to one terminal of inductor 1920. The second terminal of inductor 1910 and the second terminal of inductor 1920 may be coupled. The second terminal of each of these inductors may further be coupled to one terminal of DC flux bias element 1902. The other terminal of DC flux bias element 1902 may be coupled to ground. One terminal of inductor 1912 may be coupled via, DC flux bias element 1904, to output (Q). The other terminal of inductor 1912 may be coupled to ground. One terminal of inductor 1922 may be coupled to ground and the other terminal may be coupled to one of the terminals of inductor 1912. In operation, a positive pulse at the input (I) may create, due to the transformer couplings, a negative pulse at output Q. Conversely, a negative pulse at the input (I) may create a positive pulse at output Q.

Although FIG. 19 shows a certain number of components of flip gate 1900 arranged in a certain manner, there could be more or fewer number of components arranged differently.

Figure 20:
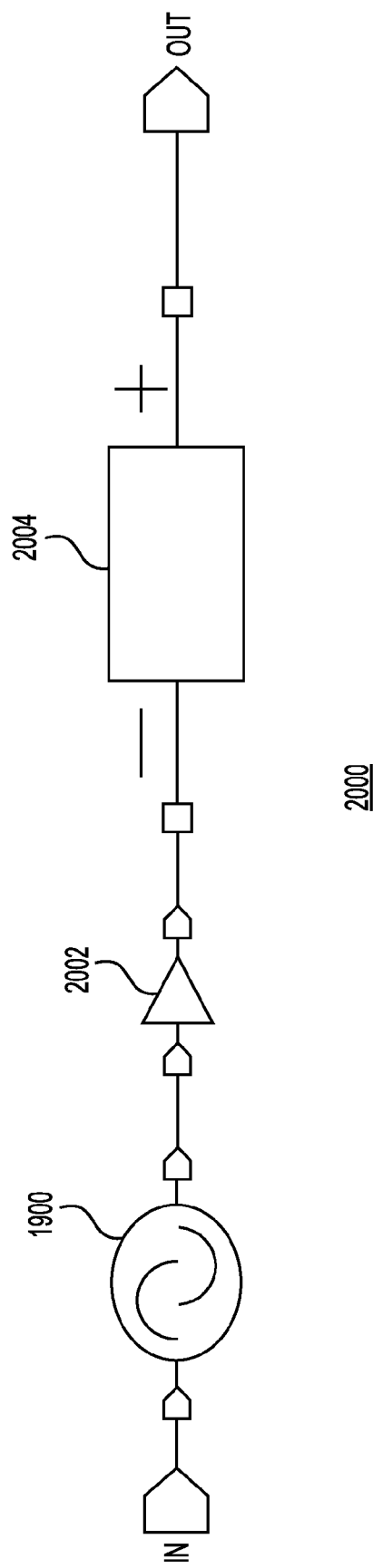
FIG. 20 shows a diagram of a phase-mode logic inverter in accordance with one example.

FIG. 20 shows a diagram of a phase-mode logic inverter 2000 in accordance with one example. Phase-mode logic inverter 2000 may include a flip-gate 1900, a JTL 2002, and a DC flux bias element 2004 coupled as shown in FIG. 20. In operation, a positive pulse received at the input (IN) may propagate through flip gate 1900. The output of flip gate 1900 may be a negative pulse (inverted by flip gate 1900). The negative pulse may then be processed by mirrored JTL 2002, which may apply a gain to the pulse. DC flux bias element 2004 may receive the processed negative pulse and it may add a full quantum of flux to the processed negative pulse resulting in an integral of the voltage of the processed negative pulse that is shifted in terms of phase. Due to the four phase clocks, inversions may necessitate a 180 degree phase shift. This happens because RQL-based Josephson transmission lines (JTLs) can only pass either a positive or a negative pulse in any given phase, but not both. Although FIG. 20 shows a certain number of components of phase-mode logic inverter 2000 arranged in a certain manner, there could be more or fewer number of components arranged differently.

Figure 21:
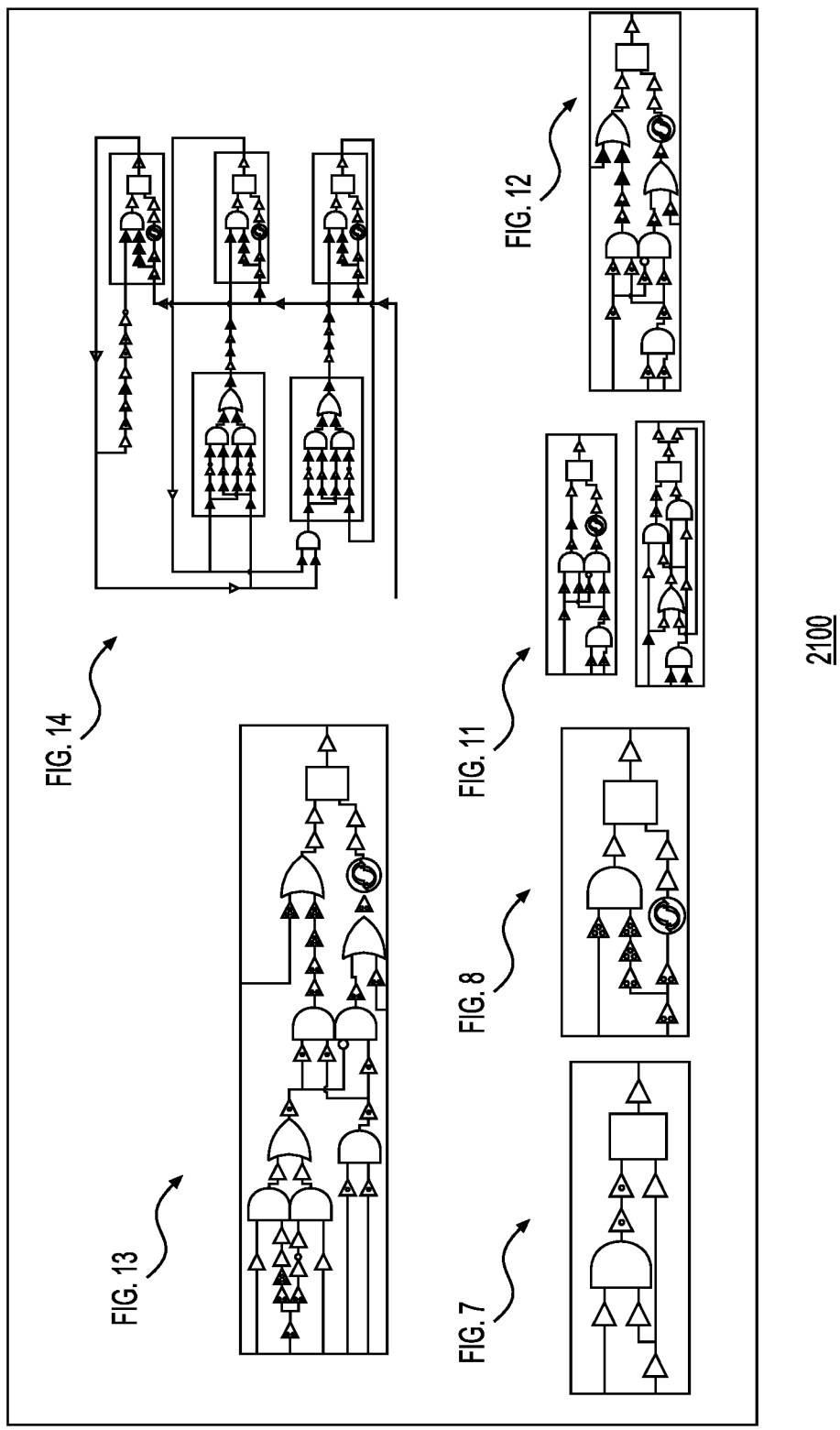
FIG. 21 shows a phase-mode logic device in accordance with one example.

FIG. 21 shows a phase-mode logic device 2100 in accordance with one example. As an example, phase-mode logic device 2100 may include various phase-mode logic circuits discussed earlier. Thus, for example, device 2100 may include any, some or all of: (1) a D flip-flop 700 (e.g., as described in FIG. 7), (2) a D-latch based flip-flop 800 (e.g., as described in FIG. 8), (3) a Glitch-Free E-DFF 1100 or a Glitch-Free E-DDFF 1150 (e.g., as described in FIG. 11), (4) a Glitch-Free E-DFF 1200 (e.g., as described in FIG. 12), or (5) a three-bit counter 1400 (e.g., as described in FIG. 14). Additionally, device 2100 may be used as part of combinational logic with other types of superconducting logic based devices. In general, any superconducting device operating in cryogenic environments and requiring combinational logic may include device 2100 or components of device 2100. Furthermore, certain logic modules need not be in a cryogenic environment; instead, they may operate at non-cryogenic temperatures. In this example, device 2100 may be in a separate cryogenic environment and may be coupled via connectors to other modules in a way that the cryogenic environment can be maintained. Device 2100 may be used as part of processing units in a data center for delivering cloud-based services, such as software as a service, platform as a service, or other services. Although FIG. 21 shows a certain number of components of device 2100 arranged in a certain manner, there could be more or fewer number of components arranged differently.

Figure 22:
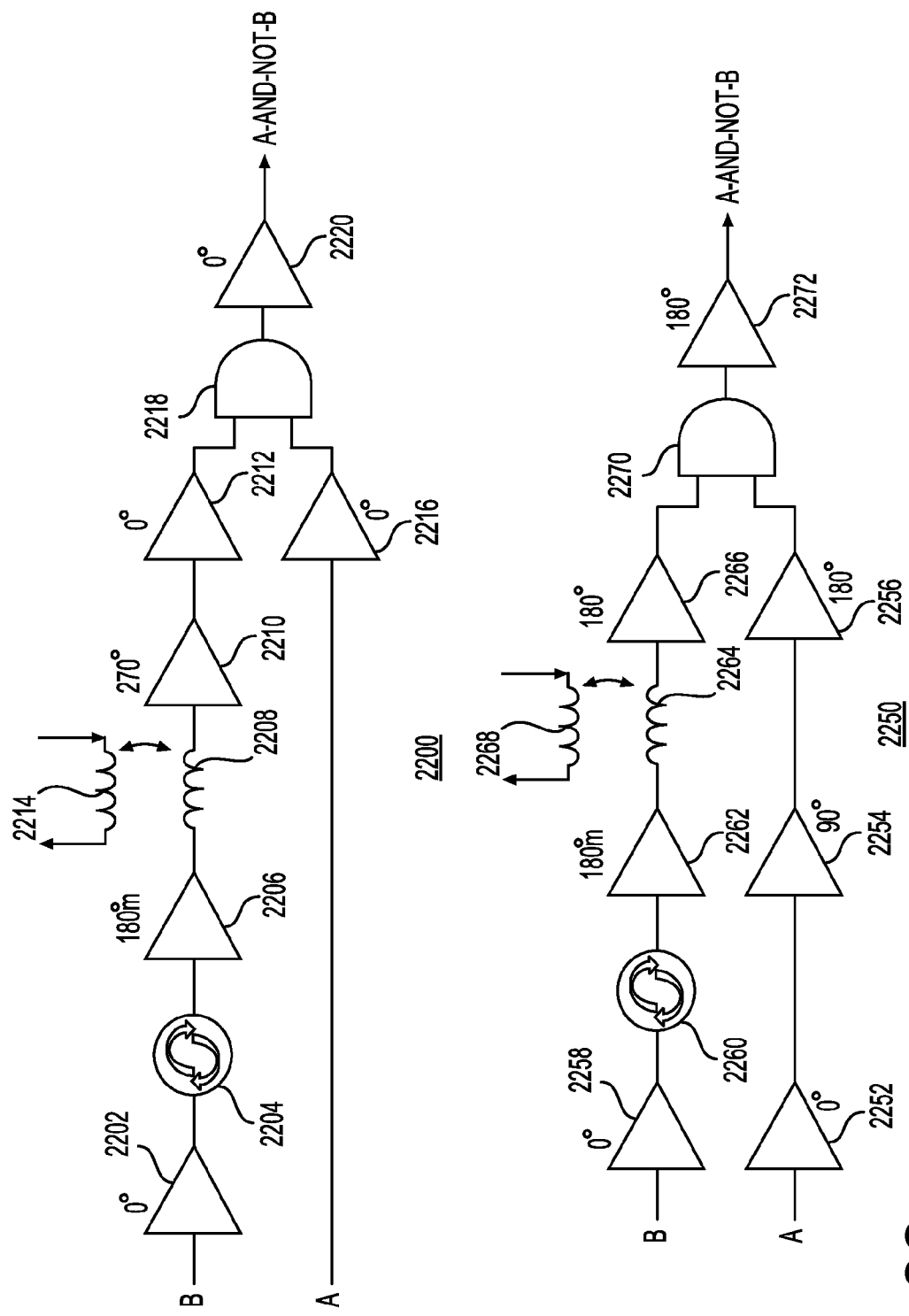
FIG. 22 shows a diagram of an A-and-not-B gate in accordance with one example and another A-and-not-B gate in accordance with another example.

FIG. 22 shows a diagram of an A-and-not-B gate 2200 in accordance with one example and an A-and-not-B gate 2250 in accordance with another example. A-and-not-B gate 2200 may have two inputs and one output (A-and-not-B). A pulse received at input A may propagate to output unless a pulse reaches input B before. A-and-not-B gate 2200 may include input A coupled to a JTL 2216. The output of JTL 2216 may be coupled to AND gate 2218. The input B may be coupled to a JTL 2202, whose output may be coupled to a flip gate 2204. The output of flip gate 2204 may be coupled to a mirrored JTL 2206, whose output may be coupled to one terminal of an inductor 2208, which may provide a DC flux bias, as result of the coupling with inductor 2214. The flip gate, the mirrored JTL, and the DC flux bias elements (inductors 2208 and 2214) may perform the same function as a phase-mode logic inverter (e.g., 2000 of FIG. 20). The other terminal of inductor 2208 may be coupled to a JTL 2210 and to a JTL 2212, whose output may be coupled to the other input of AND gate 2218. The output of AND gate 2218 may be provided as an A-and-not-B gate output. As noted earlier, the JTL labeled 180° m may operate in a mirrored domain and thus may have a data encoding in which the negative SFQ pulses arrive before the positive SFQ pulses. In addition, clock phase for each JTL is shown in degrees in FIG. 22. In operation, upon turning on the circuit for A-and-not-B gate 2000, the DC flux bias of about one SFQ may initialize the output of the phase-mode logic inverter to a phase high (or logic '1'). As an example, if a positive pulse arrives at input A (before the arrival of a pulse at input B), it may propagate to output because the other input of AND gate 2218 is receiving a logic '1' signal. However, if a positive pulse arrives first at input B, then that positive pulse may be processed by the phase-mode logic inverter resulting in a negative voltage (logic '0') being applied to the other input of AND gate 2218. This integral of the voltage applied to the input of AND gate 2218 may prevent any positive pulse arriving at the input A from reaching the output of A-and-not-B gate 2200. Although FIG. 22 shows a certain number of components of A-and-not-B gate 2200 arranged in a certain manner, there could be more or fewer number of components arranged differently. As an example, FIG. 22 further shows an alternative implementation of the A-and-not-B gate.

With continued reference to FIG. 22, A-and-not-B gate 2250 may also have two inputs and one output (A-and-not-B). A pulse received at input A may propagate to output unless a pulse reaches input B before. A-and-not-B gate 2250 may include input A coupled to JTLs 2252, 2254, and 2256. The output of JTL 2256 may be coupled to AND gate 2270. The input B may be coupled to a JTL 2258, whose output may be coupled to a flip gate 2260. The output of flip gate 2260 may be coupled to a mirrored JTL 2262, whose output may be coupled to one terminal of an inductor 2264, which may provide a DC flux bias, as result of the coupling with inductor 2268. The flip gate, the mirrored JTL, and the DC flux bias elements (inductors 2264 and 2268) may perform the same function as a phase-mode logic inverter (e.g., 2000 of FIG. 20). The other terminal of inductor 2264 may be coupled to a JTL 2266, whose output may be coupled to the other input of AND gate 2218. The output of AND gate 2218 may be provided as an A-and-not-B gate output. As noted earlier, the JTL labeled 180° m may operate in a mirrored domain and thus may have a data encoding in which the negative SFQ pulses arrive before the positive SFQ pulses. In addition, clock phase for each JTL is shown in degrees in FIG. 22. In operation, upon turning on the circuit for A-and-not-B gate 2050, the DC flux bias of about one SFQ may initialize the output of the phase-mode logic inverter to a phase high (or logic '1'). As an example, if a positive pulse arrives at input A (before the arrival of a pulse at input B), it may propagate to output because the other input of AND gate 2270 is receiving a logic '1' signal. However, if a positive pulse arrives first at input B, then that positive pulse may be processed by the phase-mode logic inverter resulting in a negative voltage (logic '0') being applied to the other input of AND gate 2270. This integral of the voltage applied to the input of AND gate 2270 may prevent any positive pulse arriving at the input A from reaching the output of A-and-not-B gate 2250.

Figure 23:
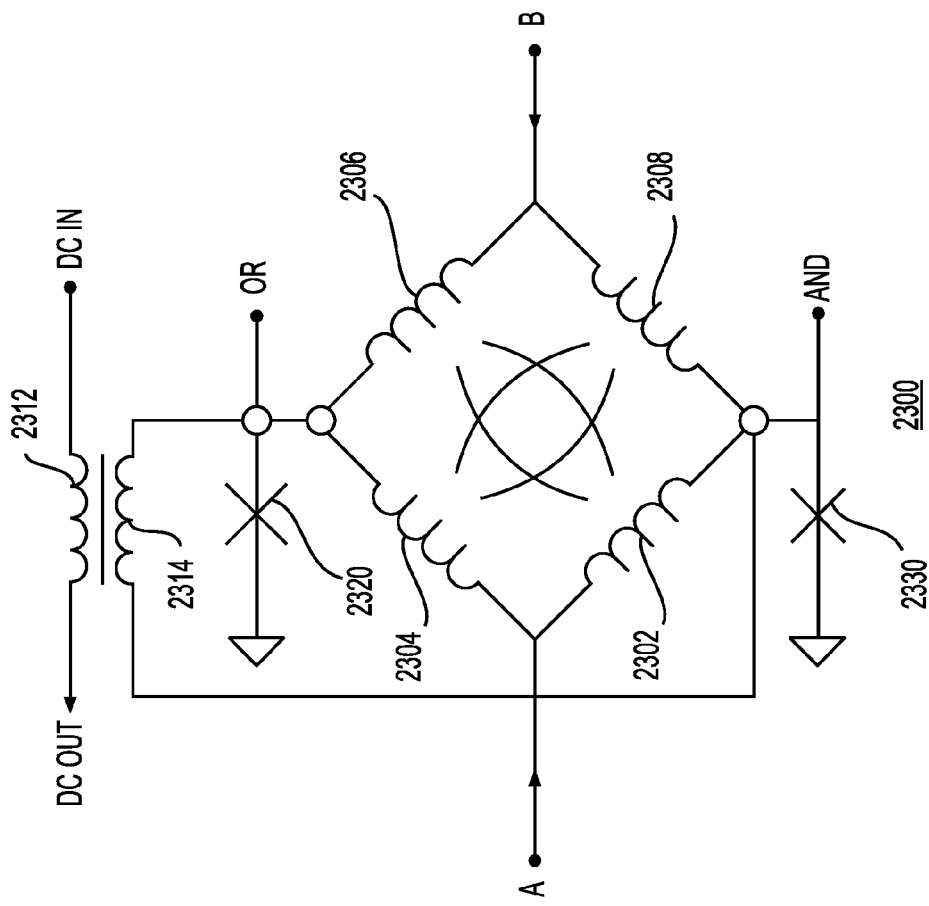
FIG. 23 shows a diagram of an AND/OR gate in accordance with on example.

FIG. 23 shows a diagram of an AND/OR gate 2300 in accordance with on example. AND/OR gate 2300 may provide each of the logical AND and the logical OR functions. AND/OR gate 2300 may include a terminal for receiving an input A, which may be coupled to one terminal of an inductor 2302. The other terminal of inductor 2302 may be coupled to one terminal of Josephson junction 2330 and to a terminal for providing the AND output. The other terminal of Josephson junction 2330 may be coupled to ground. AND/OR gate 2300 may further include terminal for receiving an input B, which may be coupled to one terminal of inductor 2308. The other terminal of inductor 2308 may be coupled to one terminal of Josephson junction 2330 and to a terminal for providing the AND output. The terminal for receiving input A may further be coupled to one terminal of inductor 2304. The other terminal of inductor 2304 may be coupled to one terminal of Josephson junction 2320 and to a terminal for providing the OR output. The other terminal of Josephson junction 2320 may be coupled to ground. The terminal for receiving input B may further be coupled to one terminal of inductor 2306. The other terminal of inductor 2306 may be coupled to one terminal of Josephson junction 2320 and to a terminal for providing the OR output. Additionally, inductor 2304 may be coupled to inductor 2308 and inductor 2302 may be coupled to inductor 2306 via transformer couplings. The terminal for providing the OR output may further be coupled to one terminal of inductor 2314. The other terminal of inductor 2314 may be coupled to the terminal for providing the AND output. An inductor 2312 may be coupled between the DC IN terminal and the DC OUT terminal. The DC flux bias may be coupled via the transformer formed by inductors 2312 and 2314. Josephson junction 2320 may be preferentially biased such that current caused by one-half quantum of flux circulates through the storage loop formed by inductor 2314 and Josephson junctions 2320 and 2330. When a positive SFQ pulse arrives at any of input A or input B, it may cause current flow from the input A and input B to Josephson junctions 2320 and 2330 through inductors 2302, 2304, 2306, and 2008, which in turn may trigger Josephson junction 2320 and thereby provide a positive pulse at the OR output. That may, in turn, reverse the direction of the current flow in the loop formed by inductor 2314 and Josephson junctions 2320 and 2330. A second arriving pulse at either input A or input B (depending upon which of the inputs received the first pulse) may again cause current flow from the inputs to Josephson junctions 2320 and 2330 through inductors 2304, 2302, 2306, and 2308. Because the DC bias has been reversed, this second pulse may trigger Josephson junction 2330 and provide a positive pulse at the output. For negative input pulses, this process happens in reverse with the first negative input pulse generating a negative pulse at the AND output and the second negative input pulse generating a negative input pulse at the OR output. In this manner, AND/OR gate 2300 may perform both the OR logical function and the AND logical function. A dedicated AND gate may be created by removing the OR output and adding a terminating resistor in parallel with Josephson junction 2320. A dedicated OR gate may be created by removing the AND output and adding a terminating resistor in parallel with Josephson junction 2330.

In conclusion, a device including a plurality of Josephson junctions and at least one terminal for receiving a sinusoidal clock signal for providing power to the at least the plurality of Josephson junctions, is provided. The device may further include at least one terminal for receiving an input signal and at least one clock terminal for receiving a return-to-zero clock signal. The device may further include at least one logic gate comprising at least a subset of the plurality of Josephson junctions, for processing the input signal and the return-to-zero clock signal to generate a first signal for the at least one latch. The device may further include at least one phase-mode logic inverter for processing the return-to-zero clock signal to generate a second signal for the at least one latch. The device may further include at least one output terminal for providing an output of the at least one latch by processing the first signal and the second signal. The at least one latch may be a D-latch. The output of the latch may be encoded as a phase-mode signal such that a logic high corresponds to a high phase of the phase-mode signal and a logic low corresponds to a low phase of the phase-mode signal. The phase-mode logic inverter may include a flip gate coupled to: (1) a mirrored Josephson transmission line and (2) a DC-flux bias circuit. The phase-mode logic inverter may be configured to change a phase of the return-to-zero clock signal from a low phase to a high phase or from a high phase to a low phase.

In another aspect, a method in a device including: (1) a plurality of Josephson junctions, (2) at least one latch, and (3) a plurality of logic gates, comprising at least a subset of the plurality of Josephson junctions, is provided. The method may include receiving a sinusoidal clock signal for providing power to the at least the plurality of Josephson junctions, receiving a return-to-zero clock signal, and receiving an input signal. The method may further include using at least the subset of the plurality of logic gates, processing the input signal and the return-to-zero clock signal to generate a first signal for the at least one latch. The method may further include using at least a phase-mode logic inverter, processing the return-to-zero clock signal to generate a second signal for the at least one latch. The output of the at least one latch may be encoded as a phase-mode signal such that a logic high may correspond to a high phase of the phase-mode signal and a logic low may correspond to a low phase of the phase-mode signal. The method may further include, based on at least the first signal and the second signal, providing an output of the at least one latch. The at least one latch may be a set-reset latch. The first signal may be configured to set the set-reset latch and the second signal may be configured to reset the set-reset latch. The at least one latch may be a D-latch. The phase-mode logic inverter may include a flip gate coupled to: (1) a mirrored Josephson transmission line and (2) a DC-flux bias circuit. The phase-mode logic inverter may be configured to change a phase of the return-to-zero clock signal from a low phase to a high phase or from a high phase to a low phase.

In another aspect, a device including a plurality of Josephson junctions and at least one terminal for receiving a sinusoidal clock signal for providing power to the at least the plurality of Josephson junctions, where the sinusoidal clock signal has at least four phases, is provided. The device may further include at least one terminal for receiving an input signal and at least one clock terminal for receiving a return-to-zero clock signal. The device may further include at least one logic gate comprising at least a subset of the plurality of Josephson junctions, for processing the input signal and the return-to-zero clock signal to generate a first signal for the at least one latch. The device may further include at least one inverter for processing the return-to-zero clock signal to generate a second signal for the at least one latch. The device may further include at least one output terminal for providing an output of the at least one latch by processing the first signal and the second signal, where the output of the at least one latch is persistent across the at least four phases of the sinusoidal clock signal. The at least one latch may be a set-reset latch. The first signal may be configured to set the set-reset latch and the second signal may be configured to reset the set-reset latch. The at least one latch may be a D-latch. The phase-mode logic inverter may include a flip gate coupled to: (1) a mirrored Josephson transmission line and (2) a DC-flux bias circuit. The phase-mode logic inverter may be configured to change a phase of the return-to-zero clock signal from a low phase to a high phase or from a high phase to a low phase.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 800, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A device comprising:
a plurality of Josephson junctions;
at least one terminal for receiving an input signal;
at least one terminal for receiving a return-to-zero clock signal;
at least one latch;
at least one terminal for receiving an enable signal, wherein the enable signal is configured to selectively suppress the return-to-zero clock signal;
at least one logic gate comprising at least a subset of the plurality of Josephson junctions, for processing the input signal and the return-to-zero clock signal to generate a first signal for the at least one latch;
at least one inverter for processing the return-to-zero clock signal to generate a second signal for the at least one latch; and
at least one output terminal for providing an output of the at least one latch by processing the first signal and the second signal.

2. The device of claim 1, wherein the at least one latch is a set-reset latch.

3. The device of claim 2, wherein the first signal is configured to set the set-reset latch and wherein the second signal is configured to reset the set-reset latch.

4. The device of claim 1, wherein the at least one latch is a D-latch.

5. The device of claim 1, wherein the at least one inverter comprises a flip gate coupled to: (1) a mirrored Josephson transmission line and (2) a DC-flux bias circuit.

6. The device of claim 5, wherein the at least one inverter is configured to change a phase of the return-to-zero clock signal from a low phase to a high phase or from a high phase to a low phase.

7. The device of claim 1, wherein the output of the at least one latch is encoded as a phase-mode signal such that a logic high corresponds to a high phase of the phase-mode signal and a logic low corresponds to a low phase of the phase-mode signal.

8. A method in a device comprising: (1) a plurality of Josephson junctions, (2) at least one latch, and (3) a plurality of logic gates comprising at least a subset of the plurality of Josephson junctions, the method comprising:
receiving a return-to-zero clock signal;
receiving an enable signal, wherein the enable signal is configured to selectively suppress the return-to-zero clock signal;
receiving an input signal;
using the plurality of logic gates, processing the input signal and the return-to-zero clock signal to generate a first signal for the at least one latch;
using at least one inverter, processing the return-to-zero clock signal to generate a second signal for the at least one latch; and
based on at least the first signal and the second signal, providing an output of the at least one latch.

9. The method of claim 8, wherein the at least one latch is a set-reset latch.

10. The method of claim 8, wherein the first signal is configured to set the set-reset latch and wherein the second signal is configured to reset the set-reset latch.

11. The method of claim 8, wherein the at least one latch is a D-latch.

12. The method of claim 8, wherein the at least one inverter comprises a flip gate coupled to: (1) a mirrored Josephson transmission line and (2) a DC-flux bias circuit.

13. The method of claim 8 further comprising, using the at least one inverter, changing a phase of the return-to-zero clock signal from a low phase to a high phase or from a high phase to a low phase.

14. The method of claim 8, wherein the output of the at least one latch is encoded as a phase-mode signal such that a logic high corresponds to a high phase of the phase-mode signal and a logic low corresponds to a low phase of the phase-mode signal.

15. A device comprising:
a plurality of Josephson junctions;
at least one terminal for receiving an input signal;

at least one clock terminal for receiving a return-to-zero clock signal;

at least one latch;

at least one logic gate, comprising at least a subset of the plurality of Josephson junctions, for processing the input signal and the return-to-zero clock signal to generate a first signal for the at least one latch;

at least one inverter for processing the return-to-zero clock signal to generate a second signal for the at least one latch; and at least one output terminal for providing an output of the at least one latch by processing the first signal and the second signal, wherein the output of the at least one latch is persistent across a plurality of phases of a sinusoidal clock signal.

16. The device of claim 15, wherein the at least one latch is a set-reset latch.

17. The device of claim 16, wherein the first signal is configured to set the set-reset latch and wherein the second signal is configured to reset the set-reset latch.

18. The device of claim 15, wherein the at least one latch is a D-latch.

19. The device of claim 15, wherein the at least one inverter comprises a flip gate coupled to: (1) a mirrored Josephson transmission line and (2) a DC-flux bias circuit.

20. The device of claim 15, wherein the at least one inverter is configured to change a phase of the return-to-zero clock signal from a low phase to a high phase or from a high phase to a low phase.

* * * * *